(12) United States Patent
Seong

(10) Patent No.: US 10,197,920 B2
(45) Date of Patent: Feb. 5, 2019

(54) LINEAR LIGHT SOURCE GENERATING DEVICE, EXPOSURE HAVING LINEAR LIGHT SOURCE GENERATING DEVICE, AND LENTICULAR SYSTEM USED FOR LINEAR LIGHT SOURCE GENERATING DEVICE

(71) Applicant: Nak Hoon Seong, Seoul (KR)

(72) Inventor: Nak Hoon Seong, Seoul (KR)

( * ) Notice: Subject to any disclaimer, the term of this patent is extended or adjusted under 35 U.S.C. 154(b) by 231 days.

(21) Appl. No.: 14/443,396

(22) PCT Filed: Nov. 15, 2012

(86) PCT No.: PCT/KR2012/009685
§ 371 (c)(1),
(2) Date: May 18, 2015

(87) PCT Pub. No.: WO2013/073873
PCT Pub. Date: May 23, 2013

(65) Prior Publication Data
US 2016/0041474 A1 Feb. 11, 2016

(30) Foreign Application Priority Data

Nov. 16, 2011 (KR) .................. 10-2011-0119514
Nov. 25, 2011 (KR) .................. 10-2011-0123966
(Continued)

(51) Int. Cl.
*G03F 7/20* (2006.01)
*G03B 21/60* (2014.01)

(52) U.S. Cl.
CPC ........ *G03F 7/70058* (2013.01); *G03F 7/2004* (2013.01); *G03F 7/2008* (2013.01);
(Continued)

(58) Field of Classification Search
CPC .. G03F 7/0058; G03F 7/2004; G03F 77/0058; G03F 77/2004
(Continued)

(56) References Cited

U.S. PATENT DOCUMENTS 4,531,812 A * 7/1985 Oguino ................ G03B 21/625
359/457
4,668,080 A * 5/1987 Gale ..................... G03F 7/2002
355/51
(Continued)

FOREIGN PATENT DOCUMENTS

KR 10-2003-0006784 A 1/2003
KR 10-2003-0078079 A 10/2003
KR 10-2007-0106936 A 11/2007

OTHER PUBLICATIONS

International Search Report for PCT/KR2012/009685 dated Mar. 29, 2013 from Korean Intellectual Property Office.

*Primary Examiner* — Hung Nguyen
(74) *Attorney, Agent, or Firm* — Maschoff Brennan

(57) ABSTRACT

Disclosed are a linear light source generator, a lenticular system used in the linear light source generator, and a stepper equipped with the linear light source generator. The linear light source generator uses a lenticular, and includes a light source and a lenticular system. A light exposure work of the stepper is performed based on a relative transfer between the linear light source generator, and a pattern film or a photo mask.

14 Claims, 12 Drawing Sheets

(30) Foreign Application Priority Data

| Dec. 20, 2011 | (KR) | 10-2011-0138548 |
| Apr. 16, 2012 | (KR) | 10-2012-0039281 |
| May 10, 2012 | (KR) | 10-2012-0049666 |
| May 14, 2012 | (KR) | 10-2012-0050834 |
| Sep. 14, 2012 | (KR) | 10-2012-0102337 |
| Oct. 23, 2012 | (KR) | 10-2012-0117622 |
| Nov. 5, 2012 | (KR) | 10-2012-0124419 |
| Nov. 14, 2012 | (KR) | 10-2012-0128792 |

(52) U.S. Cl.
CPC ........ *G03F 7/7035* (2013.01); *G03F 7/70066* (2013.01); *G03F 7/70166* (2013.01); *G03B 21/60* (2013.01)

(58) Field of Classification Search
USPC ........................................ 355/53, 67, 71, 78
See application file for complete search history.

(56) References Cited

U.S. PATENT DOCUMENTS

| 6,091,479 | A | * | 7/2000 | Frosig | G03B 35/14 355/22 |
| RE41,308 | E | * | 5/2010 | Huang | G02B 17/006 355/67 |
| 8,085,384 | B2 | * | 12/2011 | Ohkubo | G03F 7/70141 355/53 |
| 2003/0016342 | A1 | * | 1/2003 | Asami | G03B 27/20 355/78 |
| 2004/0070837 | A1 | | 4/2004 | Oda et al. | |
| 2006/0197933 | A1 | * | 9/2006 | Kawashima | G03F 7/70283 355/67 |
| 2007/0252968 | A1 | | 11/2007 | Ohkubo et al. | |
| 2010/0026993 | A1 | * | 2/2010 | Kim | G01M 11/0221 356/124 |

\* cited by examiner

LINEAR LIGHT SOURCE GENERATING DEVICE, EXPOSURE HAVING LINEAR LIGHT SOURCE GENERATING DEVICE, AND LENTICULAR SYSTEM USED FOR LINEAR LIGHT SOURCE GENERATING DEVICE

CROSS REFERENCE TO PRIOR APPLICATIONS

This application is a National Stage Application of PCT International Patent Application No. PCT/KR2012/009685 filed Nov. 15, 2012, under 35 U.S.C. § 371, which claims priority to Korean Patent Application Nos. 10-2011-0119514 filed Nov. 16, 2011, 10-2011-0123966 filed Nov. 25, 2011, 10-2011-0138548 filed Dec. 20, 2011, 10-2012-0039281 filed Apr. 16, 2012, 10-2012-0049666 filed May 10, 2012, 10-2012-0050834 filed May 14, 2012, 10-2012-0102337 filed Sep. 14, 2012, 10-2012-0117622 filed Oct. 23, 2012, 10-2012-0124419 filed Nov. 5, 2012 and 10-2012-0128792 filed Nov. 14, 2012, which are all hereby incorporated by reference in their entirety.

TECHNICAL FIELD

The present invention relates to a linear light source generator, a lenticular system used in the linear light source generator, and a stepper equipped with the linear light source generator. The present invention is also directed to a method for producing a micro-sized linear light source. The present invention is further directed to a method for manufacturing a micro-sized circuit substrate which uses a linear light source with a micro-sized line width and a micro-sized circuit substrate thereof.

The present is characterized in that it uses a linear light source characteristic provided by a lenticular. When the lenticular system according to the present invention is used, it is possible to generate a linear light source with a nanometer line-sized width. The linear light source stepper configured to generate a line width with a nanometer size is a greatly advanced invention. When a related stepper is used, the area which is exposed to light is limited. As compared with that, the stepper equipped with a linear light source generator according to the present invention does not have any limit in the length and width of a light-exposed thing which will be exposed to light. The present invention is capable of processing a large area if necessary.

The linear light source generator which uses a lenticular and the stepper equipped with the linear light source according to the present invention are made using the light condensing function of the convex lenticular. In particular, the function of a vertical light formed at a region in proximity to the center of the lend of the convex lenticular is effectively used. The linear light source generator according to the present invention uses a lenticular system wherein the lenticular may be installed in a variety of types.

The type of the lenticular system consists of a type wherein one lenticular is provided, and another type wherein a plurality of lenticulars are stacked. In the type wherein one lenticular is used, one convex lenticular is used or one concave lenticular is used. The type wherein the lenticulars are stacked consists of a type wherein the same lenticulars are stacked and a type wherein heterogeneous lenticulars are properly combined and arranged and then stacked.

The type wherein the same lenticulars are stacked consists of a type wherein only the convex lenticulars are stacked and a type wherein only the concave lenticulars are stacked. The type wherein the heterogeneous lenticulars are properly combined and arranged consists of a type wherein at least one sheet of the convex lenticular and at least one sheet of the concave lenticular are arranged in a proper sequence.

It is preferred that the lenticular of the lenticular system according to the present invention comprises a vertical light lenticular at least at a predetermined portion. The vertical light lenticular comprises a convex vertical light lenticular or a concave vertical light lenticular. Since the combining and arranging sequences of them may be determined according to each situation, so they may be applied in a variety of types.

The lenticular system may concurrently use a light condensing function of the convex lenticular and a light dispersing function of the concave lenticular. Here, the concave lenticular has a function of dispersing light. When the light disperses, the line width of the linear light source may become more micro-sized, and the number of the linear light sources increases. More precise light-exposed work may be made possible using it.

BACKGROUND ART

The stepper is generally a device for printing a predetermined pattern on a photo-resist (PR) which is sensitive to light. The above procedure consists of a few procedures as follows. First of all, there is provided a substrate on which a photo-resist is coated. On the substrate, a pattern film with a formed pattern is placed. Ultraviolet ray is canned onto the pattern film. The ultraviolet ray light-exposes through the pattern film the photo-resist in the shape same as the pattern. After the light-exposing work is done, a non-light exposed portion is chemically eliminated, thus printing a predetermined pattern.

In the present invention a variety of materials on which the photo-resist is coated is called a substrate. When a conventional circuit with fine pitches is manufactured, a parallel light stepper is generally used. The parallel light stepper costs a lot for its fabrication, and the area to be used is limited. The present invention is directed to manufacturing a stepper with a linear light source generator which uses a lenticular, not using the expensive parallel light stepper, thus substituting the related expensive equipment.

The stepper generally comprises an optical system configured to process the light of the light source by means of a variety of lens arrangement, a table, other transfer devices, a cooling device and a controller. The stepper according to the present invention is a stepper equipped with a linear light source generator which uses a lenticular. The linear light source generator comprises a light source and a lenticular system.

The light-exposing work of the stepper according to the present invention is performed based on a relative transfer with respect to the linear light source generator and the pattern film or the photo mask. The stepper according to the present invention is characterized in that the optical system used in the typical stepper is substituted with a linear light source generator of the present invention. The linear light source generator of the present invention uses a lenticular.

When the stepper with the linear light source generator of the present invention is used, the photo-resist layer may be light-exposed accurately and precisely in the same pattern as the pattern film or the photo mask. Even the pattern with fine pitches may be light-exposed, and even when the thickness of the photo-resist layer is relatively thick, a clear light exposure may be possible. The linear light source generator of the present invention is directed to substituting the complicated optical system made by processing and engaging larger lens with a simpler structure. For the sake of micro-sized and precise light exposure, a complicated and large optical system is necessary. In this case, the effective area for light-exposing the substrate is actually a palm size in the region being in proximity to the center of the optical system. However, the present invention may provide the effective area as large as desired using a simple lenticular system. Most of the thickness of the lenticular system of the present invention are within 1 mm. With the current science standard, there is a physical limit in manufacturing the larger lenses belonging to the optical system. Even with the current science standard, there is not a limit in making the lenticular larger in a simple way. As one of the biggest advantages, the stepper with the linear light source generator of the present invention is strong against the vibrations. The stepper of the present invention is characterized in that an accurate light exposure may be possible even under vibration environments.

DISCLOSURE OF THE INVENTION

Accordingly, it is an object of the present invention to provide a linear light source generator, a lenticular system used in the linear light source generator and a stepper with the linear light source generator. The present invention is directed to a method for producing a micro-sized linear light source. Also, the present invention is directed to a method for manufacturing a micro-sized circuit substrate using a linear light source having a micro-sized line width and a micro-sized circuit substrate using the same.

The present invention uses a linear light source characteristic of the lenticular. Since the stepper with the linear light source generator of the present invention may be manufactured at a low cost, it is expected that economic impacts may be greatly applied to the field of the stepper. Using the stepper of the present invention, the large area fine pitch circuit, which was impossible to be fabricated even using the parallel light stepper, can be mass-produced, which means that a great advancement is made in the technical field of the stepper.

The present invention is characterized in that the light exposure of the micro-sized circuit can be processed at a low cost, and it is an object of the present invention to develop a light exposure technology which is capable of light-exposing a large area. For this technology development, the present invention uses a condensing function of the convex lenticular and a vertical light function. In such a way to use the characteristics of the lenticular as greatly as possible, it is possible to easily perform a light exposure using the light exposure technology of the present invention even when the substrate has a thick photo-resist layer or the circuit needs a construction of very fine pitches. The largest feature when using the linear light source generator of the present invention is that the ultra micro-sized circuit with a few tens of microns in size can be light-exposed, and fast light exposure is possible with the large area, and a continuous light exposure work can be performed by means of the scanning work of the linear light source.

In terms of the work environment, it is essential that the process with laser is performed in a space without vibrations. The stepper with the linear light source generator of the present invention does not make any defect at the finished product even when there is a little vibration. The micro-sized circuit by laser is formed in a dot light source. For this, the linear light source generator of the present invention is formed in a linear light source type, so such matters are different.

In respect of the speed of the light exposure, when scanning with the linear light source of the present invention, the large area can be productively light-exposed. When carefully observing the finished product of the light exposure after the light exposure made by the laser formed of a dot light source, it is observed that the cross section of the light exposure looks rough. However, the cross section of the light exposure by the stepper of the present invention looks clean.

So as to light-expose the ultra micro-sized circuit, the conventional art uses a parallel light stepper. In this case, the parallel light stepper has a complicated optical system structure along with expensive manufacture cost. Since the large convex lens and concave lens are coupled, the complicated combination is necessary, so such an optical system needs higher cost. Even when the large optical system is made, the effective area of the optical system for an actual work is limited to the portion being proximity to the center of the lens. However, the stepper of the present invention with the linear light source generator has a simple structure and does not use an expensive equipment and is manufactured using only the optical characteristics of the lenticular lens. The light of the linear light source of the present invention has a vertical light having a line type or a semi-parallel light characteristic having a line type. The vertical light with a line shape having a micro-sized line width has minimized light dispersion or diffraction and scattering operation even when it transmits the pattern film, so it is possible to light-expose precisely the ultra micro-sized pattern.

In order to implement the ultra micro-sized circuit with a large area, the following conditions are required. The linear light source generator of the present invention satisfies the following conditions. First, the diffraction, dispersion and scattering of light should be prevented. Second, linear light source is essential because fast scanning is possible. Third, the light energy should be condensed by the lens. Fourth, the linear light source of the micro-sized line width which is much finer than the light-exposed ultra micro-sized circuit should be provided. Fifth, there should be a distance so that the linear light source and the linear light source don't come into contact with each other.

Technical Solution

To achieve the above objects, the light generated by the linear light source generator of the stepper of the present invention is scanned through the pattern film or the photo mask onto the substrate on which the photo-resist layer is formed. The scanned light light-exposes the photo-resist layer in the same shape as the pattern of the pattern film or the photo mask.

The embodiments of the linear light source generator of the present invention may be implemented in various forms. In the present invention, the linear light source generator using the lenticular which is a key component comprises a light source and a lenticular system. In the linear light source generator, micro-sized vibrations may be applied through the vibration means to the lenticular system.

As a typical type, the light source and the lenticular system are fixed when in use so as to prevent relative movements between them. When performing the light exposure work in such a way to apply the linear light source generator to the stepper of the present invention, the linear light source generator performs a relative transfer operation between them with respect to the pattern film installed at the stepper.

The present invention uses a linear light source provided by the lenticular. The lenticular used at the linear light source generator may be configured to has a variety of pitches and focal distances based on the purpose of light exposure. In order to light-expose the very fine pitches, it needs to design the pitches of the lenticular to be very fine pitches. It is preferred that the linear light source generator uses the vertical light function of the convex lenticular as greatly as possible wherein the light from the convex lenticular goes downward vertically. The detailed description of the vertical light will be described later. When applying to the stepper the linear light source generator using the lenticular of the present invention, the linear light source generator should be positioned on the top of the pattern film or the photo mask.

When it needs to continuously light-expose the flexible substrate using the stepper of the present invention, it is preferred that the linear light source generator should be spaced apart by a predetermined distance from the pattern film or the photo mask, thus preventing any interference between them. In a state that the linear light source generator is spaced apart from the pattern film, the light exposure work is performed by means of a relative transfer work between them.

Through such transfer work, even when the area of the substrate is large, it is possible to easily light-expose through the scanning work of the linear light source generator. Generally speaking, in all the steppers, the substrate slightly coated with the photo-resist is positioned beneath the pattern film or the photo mask. When the light exposure work is being performed, there should be not any slip between the substrate and the pattern film, and not any relative movement between them also. During the light exposure work, the substrate and the pattern film should move along like the integrated structure movement.

The concave lenticular used at the lenticular system of the present invention serves to make a linear light source with narrower line width using the linear light condensed by means of the convex lenticular. At the same time, the number of the lines of the light of the linear light source increases. When using the linear light source which increases the number of the lines of the linear light source and has narrower line width, more precise light exposure is possible. When using the lenticular system combined with the characteristics of the concave lenticular and the convex lenticular, it is possible to make a ultra micro-sized linear light source wherein the line width of the linear light source may be tens or hundreds of nanometer sizes. It means that when the stepper with the linear light source generator of the present invention is used, it is possible to light-expose up to fine pitches of a few microns in size.

In the stepper of the present invention, when the function of the vertical light of the convex lenticular is used, a clean light exposure can be made even when the pitches of the circuit to be light-exposed is a few microns in size, and the thickness of the used photo-resist layer is over a few tens of microns in size. Since the characteristics of the vertical light lie in that the diffraction, interference and scattering of the light can be minimized, which means that the light exposure of the ultra micro-sized circuit may be possible. When performing the light exposure work using the stepper of the present invention, the circuit does not have any defects and is distinct and clean. Even though the large area substrate is light-exposed, the stepper with the linear light source generator of the present invention can light-expose at a tome the large area through the relative transfer movement of the linear light source generator.

In the stepper of the present invention, it needs to relatively transfer the linear light source generator and the pattern film or the linear light source generator and the photo mask. As a method for a relative transfer, first, there are some occasions. First, in a state that the pattern film or the photo mask is stopped, the linear light source generator is transferred. Second, in a state that the linear light source generator is stopped, the pattern film or the photo mask is transferred. Third, the linear light source generator and the pattern film or the photo mask concurrently move. When designing the stepper of the present invention, it is possible to design based on the necessity.

Advantageous Effects

The linear light source generator of the present invention is directed to mainly using the condensing function of light that each lens belonging to the convex lenticular has. In particular, when the linear light source having micro-sized line widths is used, the concave lenticular and the convex lenticular are stacked. Each lens of the convex lenticular serves to condense the light from the light source into a shape of a linear light source, and each lens of the concave lenticular serves to separate, namely, disperse into a shape of a linear light source. The lenticular system wherein the convex lenticular and the concave lenticular are stacked are configured to concurrently perform the condensing function and dispersing function of the light. The light from the lenticular system is formed in a shape of line.

The present invention uses a vertical light function wherein light travels downward vertically. The convex lenticular serves to condense the light source at a focus point by reflecting the light. However, the reflection operation of the light weakly occurs at the region being proximity to the center of the lens of the convex lenticular. This region does not reflect the light from the light source, but directly let it go downward. The present invention is directed to using the vertical light function that the convex lenticular has.

When using the stepper with the linear light source generator which uses the vertical light lenticular, a precise light exposure work may be possible even when the thickness of the photo-resist layer may be a few tens of microns in size, and the pitches to be light-exposed is a few microns in size. Even when the pitches of the pattern formed by the pattern film or the photo mask is very fine pitches, distinct and clear light exposure can be obtained since the scattering, diffraction, dispersion, etc. of the light are minimized.

The related parallel light stepper will be compared with the stepper of the present invention. First of all, the parallel light stepper requires an expensive optical system. In contrast, the stepper of the present invention is economical since it uses only the physical function of the lenticular. In the related parallel light stepper, a large are light exposure is hard, but in the stepper of the present invention, the large area light exposure is very easy through the relative transfer of the linear light source generator.

The linear light source generator and the lenticular system of the present invention may be widely applied to the stepper as well as the video device and the video panel. The video panel used in the conventional video device is characterized in that the light from the backlight is transferred through a polarization filter. At this time, when the light transmits the polarization filter, the light of the backlight greatly decreases, which results in a lot of power loss. However, when the linear light source generator of the present invention is used at the video device, it does not need to use the polarization filter. The polarization filter serves as a role of the linear light source. The linear light source generator of the present invention itself plays a role of the linear light source without any polarization filter. In addition, the linear light source generator of the present invention can provide a linear light source without any loss in the light. Therefore, when the linear light source generator of the present invention is substituted with the backlight and the polarization filter of the video panel, it is possible to greatly increase the service life of the battery thanks to no loss in power.

When the linear light source generator of the present invention is applied to the video panel, it is possible to apply small vibrations to the lenticular system. When observing the linear light source generated by the linear light source generator of the present invention, it is observed that there is an interval of a few microns in size between the linear light source and the linear light source. Such interval may be resolved by means of small vibrations which are applied to the lenticular system. More specifically, when the lenticular system is vibrated by means of the vibration means, the empty space between the linear light source and the linear light source can be filled for a split second by means of the vibration means. By means of the vibrations of the lenticular system, an optical illusion effect may be applied using afterimage to the video panel. Due to the small and high speed vibrations, the eyes of the person may not recognize the blank portions.

LEGEND OF REFERENCE NUMBER

Figure 1:
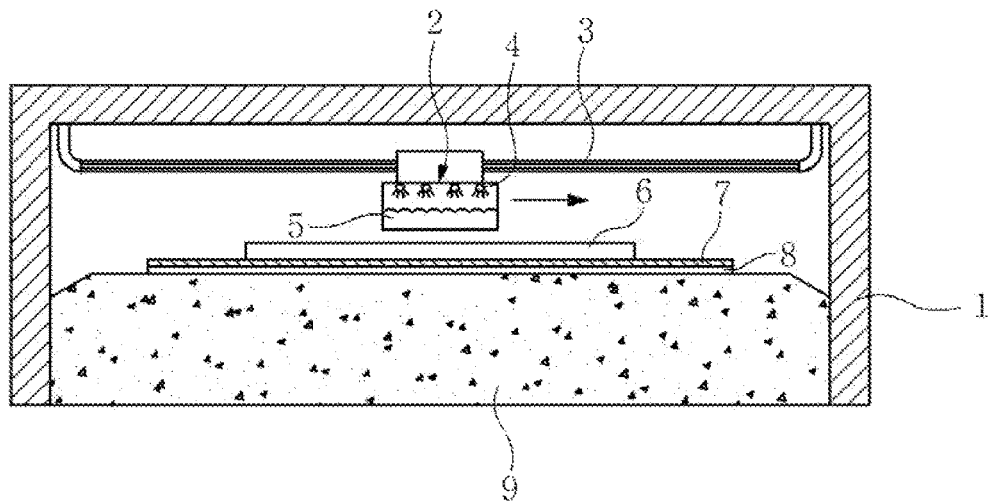
FIG. 1 is a whole conceptual view illustrating a stepper equipped with a linear light source generator according to the present invention.

| 1. stepper | 2: linear light source generator |
|---|---|
| 3. linear light source generator transfer unit | 4: light source |
| 5: convex lenticular, lenticular assembly | |
| 6: film | 7: photo-resist |
| 8: flat plate | 9: substrate structure |
| 11: convex lenticular lens | 34: concave lenticular |
| 73: elastic unit | 74: compression roller |
| 62, 64, 65: auxiliary roller | 63: pattern film |
| 68: close contact unit | 69: table |
| 70: substrate | 71: conductive layer |
| 72: photo-resist layer | 75: linear light source generator |

Modes for Carrying out the Invention

The present invention is directed to a linear light source generator which uses a lenticular. In addition, the present invention is directed to a lenticular system used for the linear light source generator. Also, the present invention is directed to a stepper equipped with the linear light source generator. The present invention is directed to a method for generating a micro-sized linear light source which converts a common light from a light source into a linear light source having a micro-sized line width. At this time, the linear light source generator uses a lenticular system which has fine pitches. The present invention is also directed to a method for manufacturing a micro-sized circuit substrate which uses a linear light source having a micro-sized line width and a micro-sized circuit substrate manufactured by the same.

A variety of embodiments of the present invention will be described hereinafter. The present invention basically uses the characteristics of the linear light source generated using the lenticular system according to the present invention. The linear light source generator of the present invention is manufactured using the lenticular system. The present invention is directed to manufacturing a stepper which is equipped with the linear light source generator. When the linear light source generator of the present invention which uses a lenticular is used, it is possible to generate a micro-sized linear light source wherein the line width of the linear light source is nanometer-sized. In order to manufacture the linear light source having a nanometer-sized line width, the lenticular system of the present invention is constituted. The linear light source generator which uses the lenticular system of the present invention may be efficiently used in other industrial fields, and may be most efficiently used in the field of the stepper.

The linear light source generator which uses a lenticular of the present invention may equip with additional equipment, but basically comprises a light source and a lenticular system. The light source may be obtained by using a surface light source based on the use of a compound semiconductor or using a plurality of LEDs as a light source. Instead of the LEDs, all kinds of the light emitting components may be used as a light source. The lenticular system of the present invention comprises a sheet of the convex lenticular. However, in almost cases, it is constituted by stacking one sheet of the convex lenticular and one sheet of the concave lenticular. A plurality of lenticulars may be stacked. In terms of the light source of the present invention, the intensity of the light which is used during the light exposure is very important. The uniform distribution of light plays an important role. It is preferred that the light from the light source is uniformly scanned over the whole areas of the lenticular system with the uniform distributions and uniform intensity.

In the stepper of the present invention, the linear light source generator of the present invention may perform a light exposure work when there is a relative transfer with respect to the pattern film disposed at the stepper. The light source and the lenticular system belonging to the linear light source generator of the present invention are configured to move in the same direction and at the same speed without any relative movement between them and are configured to transfer relatively with respect to the pattern film of the stepper. For this, the stepper of the present invention is characterized in that the light source and the lenticular system are frequently mounted at one container. When the light source and the lenticular system are mounted at one container, in the container, the light source may move on the plane or small vibrations may be applied to the lenticular system. However, in this case, since the light source and the lenticular system are mounted at one container, a relative transfer should occur with respect to the pattern film of the stepper at the same speed and in the same directions.

In the present invention, it is ideal that the light which passed through the linear light source generator of the present invention travels downward in the vertical direction. When such light travels downward in the vertical direction, the light directly travels downward without dispersing aside or diffracting. In the present invention, such linear light source generator is called a vertical light linear light source generator. In order to generate a vertical light, the function of the region of the center of the lenticular lens is mainly used.

In the present invention, the lenticular which has a function of allowing the light to directly travel downward with respect to the substrate is called a vertical light lenticular. The vertical light lenticular newly defined in the present invention does not represent the light which travels downward in a perfect direction. The vertical light defined in the present invention represents that the condensed light travels in an almost vertical direction.

In the present invention, the vertical light lenticular consists of two kinds There are a vertical light lenticular formed of a convex lenticular, and a vertical light lenticular formed of a concave lenticular. Here, the vertical light lenticular formed of the convex lenticular is called a convex vertical light lenticular, and the vertical light lenticular formed of the concave lenticular is called a concave vertical light lenticular. In the present invention, what is called the vertical light lenticular represents a convex or concave vertical light lenticular. The concave vertical light lenticular and the convex vertical light lenticular correspond to each other like the female threads and the male threads. When either the convex vertical light lenticular or the concave vertical light lenticular is made, the other one is made by forming a release layer, and the release layer is coated and duplicated.

The lenticular used in the linear light source generator of the present invention may be formed of a common lenticular. However, in this case, the precision of the light exposure work may be degraded. In the linear light source generator of the present invention, the stepper of the present invention and the lenticular system of the present invention, it is preferred that a vertical lenticular is used so as to precisely perform the function of the lenticular which generates a linear light source.

In the type of the lenticular system used in the present invention, the most simple and basic type of the lenticular system is formed of one convex lenticular. As the next most simple and basic type of the same, one sheet of the concave lenticular is stacked beneath on one convex lenticular. However, in order to obtain various effects, it may be made in a stacked structure wherein at least one sheet of the convex lenticular and at least one sheet of the concave lenticular are stacked. The lenticular stack assembly is formed in such a way that the convex lenticular or the concave lenticular are combined in a proper sequence and are arranged.

The stepper of the present invention will be described below. Before the stepper of the present invention is described, the common concept of the stepper of the present invention will be first described. For describing the detailed construction of the same, it is divided into the upper structure and the lower structure, and the embodiments of the same will be described.

The stepper of the present invention comprises a linear light source generator which uses a lenticular. The linear light source generator comprises a light source and a lenticular system. The light exposure work of the stepper of the present invention is performed through a relative transfer between the linear light source generator and the pattern film. In the description of the present invention, since the pattern film and the photo mask both perform almost same purpose and function, the descriptions of the pattern film may be applied identically to the photo mask unless otherwise stated herein.

When the light exposure work is performed using the stepper of the present invention, the light exposure work can be performed only when there is a relative transfer work between the linear light source generator and the pattern film. For performing the light exposure work, the relative transfer work between the linear light source generator and the pattern film may be formed of three occasion. First, the linear light source generator moves, and the pattern film is fixed. Second, the linear light source generator is fixed, and the pattern film moves. Third, the linear light source generator and the pattern film both move, and the moving speeds between them are different.

The structures of the substrate beneath the pattern film and the motion with respect to the table underneath the substrate may be properly designed based on necessity. The stepper of the present invention may be formed in a type among the following three types. In each case, a predetermined structure design is required based on the operation structure of the stepper. Since the above-mentioned structure design corresponds to a known art, the descriptions of the same will be omitted.

In order to describe the structure of the stepper of the present invention, the upper structure of the stepper of the present invention will be first described. At the upper structure, there is installed a linear light source generator. The upper structure may further comprise a transfer unit for transferring the linear light source generator, a cooling unit for cooling the heat of the light source, a controller, etc. In addition, the upper structure may further comprise an elastic roller.

The lower structure of the stepper of the present invention is disposed beneath the upper structure. A table is basically provided under the lower structure of the stepper of the present invention. A substrate on which a photo-resist is coated is detachably secured to the table. A close contact unit may be provided at the table so as to closely contact the substrate. The lower structure comprises a transfer unit for transferring the table, a cooling unit for cooling the linear light source generator, an electric power supply unit, a controller, etc.

Between the upper structure and the lower structure, a substrate on which the pattern film or the photo mask and a photo resist are formed is detachably disposed. The pattern film or photo mask disposed between the upper structure and lower structure and the substrate on which the photo resist is formed are detachable when the light exposure work is being prepared or is finished. What are detachable from the stepper structure of the present invention are not considered as the components of the stepper, but are considered as auxiliary components.

The standard construction sequence of the stepper of the present invention is as follows. Such a sequence may change depending on each situation and characteristic. Between the linear light source generator and the table, the pattern film or the photo mask and the substrate are disposed. The substrate is disposed beneath the pattern film or the photo mask and is detachably mounted on the table. Below the table, there are provided a close contact unit for closely contacting the substrate to the table, a transfer unit for transferring the table, a cooling unit for cooling the heat of the light source, an electric power supply unit, a controller, etc.

The light of the light source generated by the linear light source generator of the present invention is scanned onto the pattern film or the photo mask of the stepper. The light of the light source passes through the pattern film or the photo mask and light-exposes the photo resist layer of the substrate.

When the light exposure work is being performed, the pattern film or the photo mask remains closely contact with the substrate or spaced apart from it. When the light exposure work is being performed, there should not be any slip between the pattern film or the photo mask and the substrate. When the light exposure work is being performed, it is common that the substrate comes into close contact with the table, thus not causing any slip, but the substrate may slip against the table.

When the light exposure work is being performed, the occasion that no slip occurs between the substrate and the table is when the substrate and the table may come into close contact by means of the close contact unit based on the vacuum pressure formed on the table. In this case, there may be a way wherein the linear light source generator moves, and the table is fixed. Alternatively, the linear light source generator is fixed, and the table may move.

When the light exposure work is being performed, the occasion that the slip occurs between the substrate and the table is when a continuous light exposure work is being performed as the substrate is wound on a reel using a flexible substrate. At this time, both the table and the linear light source generator are stopped, and the pattern film and the substrate are in close contact with each other or are spaced apart from each other in a form of one body, so they move slipping against the table.

In this case, the upper structure is equipped with the elastic roller. The pattern film may be compressed using the elastic roller. More specifically, as it is compressed by the elastic roller, the pattern film comes into close contact with the substrate, and the pattern film and the substrate becomes one body and move slipping against the stopped table. At this time, it is preferred that the elastic roller may be configured to move together like one body with the linear light source generator. At this time, during the light exposure work, the upper structure including the linear light source generator remains stopped.

In the stepper of the present invention, the transfer device for relatively transferring the upper and lower structures, the cooling device for cooling the heat from the linear light source, the upper structure driving device, the lower structure driving device, the controller, the electric power supply device, etc. may be substituted with ordinary devices, so the detailed description thereof will be omitted in the present invention. The embodiment of the stepper of the present invention will be described and is not limited thereto unless such embodiment is out of the subject matter of the present invention.

FIG. 1 is a view for describing the concept of the stepper of the present invention. The stepper of the present invention comprises a linear light source generator of the present invention. Here, the stepper 1 of the present invention comprises a substrate structure 9, a linear light source generator 2, and a device unit including an opening and closing unit. The detailed construction of the stepper of the present invention will be described layer after dividing them into the upper structure and the lower structure.

The linear light source generator 2 of the present invention basically comprises a light source 4, and a lenticular system 5. It is preferred that the light source 4 is configured to uniformly scan onto the whole area of the lenticular system. The most important component in the stepper with the linear light source generator of the present invention is a lenticular system of the present invention.

The linear light source generator of the present invention is provided in various types. The linear light source generator comprises a light source and a lenticular system. There should not be any relative movement between the lenticular system and the light source. The most simply constituted type of the linear light source generator may be provided in such a way that the light source and the lenticular system are mounted on the same frame. In this case, in the container, the light source may fluctuate or the lenticular may slightly vibrate. During the light exposure work, the linear light source generator performs a relative transfer movement against the pattern film disposed at the stepper.

In this way, what the light source and the lenticular system are mounted in the same container is a common construction in the linear light source generator of the present invention. It is obvious that the light source and the lenticular system may not also be mounted in the container, but they may be mounted at various types of structures. What the light source and the lenticular system move together in the same directions and at the same speed is one of the key concepts of the present invention. Generally considering, the mechanism for preventing any relative movement between the light source and the lenticular system is one of the key technology of the present invention. What the light source is stopped, and the lenticular system is stopped belongs to the concept that the light source and the lenticular system in whole move in the same directions and at the same speed.

Among the technologies adopting the lenticular, there is a 3D image camera technology which is different from the mechanism of the linear light source generator of the present invention. In the 3D image camera, a convex lenticular is positioned in front of the film on which an image is recorded, which uses a method wherein when taking a picture of the 3D image, the shutter of the camera is opened so as to open the lens, and the convex lenticular and the film are stopped, thus recording a plurality of images while moving the pictured object. Alternatively, there is another way wherein a plurality of images may be recorded while moving the convex lenticular and the film in a state that the pictured object is stopped. The above-described mechanism has a big difference as compared with the mechanism of the present invention. The pictured object means a light source.

More specifically, the 3D image camera uses a mechanism wherein only the light source moves while the lenticular is stopped or only the lenticular moves while the light source is stopped. The mechanism for recoding the 3D images using the convex lenticular has been generally used in the 3D image recording device. When observing the 3D images, it is possible to recognize that the images are recorded through each convex lenticular lens onto the film, which means that a plurality of the images having different optical angles with respect to the same object are recorded in multiple numbers in one lenticular pitch. More specifically, in the pitch of each lens of the convex lenticular, the images of the object having a plurality of different optical angles are recorded, thus viewing the 3D image.

On the table of the stepper of the present invention, a substrate on which a photo resist is uniformly coated is positioned. Such a substrate may be detachable when the light exposure work is being prepared or it is finished. The substrate may come into close contact with the top of the table by means of the close contact unit. The pattern film or the photo mask is positioned on the substrate. The pattern film or the photo mask may be detachable from the table when the light exposure work is being prepared or it is finished.

The pattern film or the photo mask is installed in close contact with the substrate or spaced apart from the substrate. During the light exposure work, there should not be any relative movement between the pattern film or the photo mask and the substrate. During the light exposure work of the stepper of the present invention, the pattern film or the photo mask should have a relative transfer against the linear light source generator. More specifically, when the linear light source generator is stopped, the pattern film or the photo mask is transferred, and when the pattern film or the photo mask is stopped, the linear light source generator is transferred. Of course, it is possible to let both the linear light source device and the pattern film to be transferred; however at this time the transfer speeds of them should be different from each other.

In the stepper of the present invention, the lenticular system of the linear light source generator is disposed below the linear light source generator. It is preferred that the lenticular system disposed below the linear light source generator is spaced apart by a predetermined interval so as to prevent any friction with respect to the movements of the pattern film or the photo mask. For the sake of the precise light exposure work, it is preferred that the interval is as small as possible.

The relative transfer may be made by means of a variety of transfer units 3. In the stepper of the present invention, a motor and a rail may be used so as to transfer the linear light source generator. Alternatively, a rack and pinion structure may be used or a linear guide, etc. may be used. Namely, various types may be used. As illustrated in FIG. 1, the transfer may be performed by the driving of the motor using a slider rod.

During the light exposure work of the present invention, it is obvious that in the linear light source generator remains stopped, a substrate structure 9 disposed below the linear light source generator is moved. The substrate structure of the present invention collectively represents the structure positioned below the linear light source generator. The substrate structure comprises a table, a table transfer device, a vacuum pressure generator, a cooling unit, etc. The substrate on which a photo-resist is coated is detachably placed on the table. The substrate is a separate component from the substrate structure.

When the substrate is installed on the table, a close contact unit may be used so as to let the substrate to come into close contact with the table using the vacuum pressure. The table transfer device configured to move the table of the stepper may be provided in various forms. Such devices all are included in the substrate structure. Below the pattern film 6 or the photo mask, the substrate is installed being detachable from the table of the stepper. The photo-resist 7 is uniformly coated on the substrate. The pattern film or the photo mask may be installed in close contact with the substrate or may be installed spaced apart from it. During the light exposure work, the pattern film or the photo mask must not relatively move with respect to the substrate.

A transparent protection film is coated on the photo-resist of the substrate so as to protect the photo-resist. During the light exposure work using the stepper of the present invention, the light exposure work is performed with the transparent protection film being attached or it is performed with the transparent protection film being removed. When the light exposure work is performed with the transparent protection film being attached, the photo-resist can be protected, and when the light exposure work is performed with the transparent protection film being removed, a precise light exposure may be performed.

When the light exposure work is performed with the transparent protection film being removed, the pattern film or the photo mask should not damage the photo-resist layer. For this, first, the light exposure work may be performed by spacing apart the pattern film or the photo mask by a predetermined interval from the photo-resist layer. Second, the light exposure work is performed being in close contact with the photo-resist after increasing the heterogeniety on the surface of the pattern film or the photo mask.

When the light exposure is performed with the protection film being coated on the photo-resist, the photo-resist may not be preferably damaged. Theoretically speaking, the first most precise light exposure may be obtained in such a way that the light exposure work is performed by closely contacting the pattern film or the photo mask to the photo-resist in a state that the protection film of the photo-resist layer is peeled off. The second most precise light exposure may be obtained in such a way that the light exposure work is performed by closely contacting the pattern film or the photo mask to the photo-resist layer. The third most precise light exposure may be obtained in such a way that the light exposure work is performed by spacing apart the pattern film or the photo mask from the photo-resist layer in a state that the protection film of the photo-resist layer is peeled off. The fourth most precise light exposure may be obtained in such a way that the light exposure work is performed by spacing apart the pattern film or the photo mask from the photo-resist layer in a state that the protection film of the photo-resist layer is coated. Doing the light exposure work in a state that the protection film is coated is preferred in terms of the purpose because the photo-resist layer is not damaged, but an adverse effect such as the diffraction or interference and dispersion of the light due to the transparent protection film may occur. The stepper of the present invention may be manufactured in a structure which properly meets the light exposure condition and state on the spot.

When the light is scanned from the linear light source generator 2 of the present invention onto the pattern film 6, the light transmits the transparent portion of the pattern film, and the nontransparent portion blocks the light. The light condensed by the linear light source generator 2 of the present invention transmits the transparent portion of the pattern film 6 and cures the photo-resist layer. When the light of the linear light source generated by the linear light source generator of the present invention is scanned onto the pattern film, the photo-resist is light-exposed in the same pattern as the pattern film. After the light exposure work, the portion where the photo-resist is not light-exposed, namely, the non-cured portion is chemically removed. The pattern by the light exposure unit is formed on the flat plate 8.

In the stepper of the present invention, the substrate is detachably positioned on the table of the stepper. During the light exposure work, it is preferred that the substrate is in close contact with the table. For this, small air holes are formed on top of the table, so it is preferred that the substrate comes into close contact with the table with the aid of the vacuum air pressure from such holes. For convenience for the descriptions of the present invention, the place on which the photo-resist is uniformly coated is called a substrate. When the substrate is arranged in a flat shape, it is called a flat plate. The pattern film or the photo mask are detachable and are positioned below the linear light source generator and on the top of the substrate.

In a state that the light exposure work is being performed using the stepper of the present invention, the pattern film must not have any relative movement including the slip against the substrate. The substrate on which the photo-resist is uniformly coated may be implemented in various forms. There may be a type wherein the photo-resist may be thinly formed on the substrate which is not transformed and solid. If it is wound with the flexible substrate, the light exposure may be continuously performed.

In the stepper of the present invention, at both sides of or at one side of the table of the stepper, a roller may be provided so as to wind the flexible substrate. In this way, since the flexible substrate may be wound in a reel shape, the light exposure work can be continuously performed.

In the linear light source generator of the present invention, it is obvious that other components may be further provided for the sake of additional functions in addition to the light source and the lenticular system. Even when additional components are added to the linear light source generator of the present invention, if the light source 4 and the lenticular system 5 disposed below the light source which are the key components of the present invention are necessarily included, all other components may be considered being included in the linear light source generator of the present invention.

The lenticular system of the present invention may consist of a type wherein one lenticular is provided, and another type wherein multiple lenticulars are stacked. When one lenticular is provided, one convex lenticular may be used or one concave lenticular may be used. The type wherein the stacked lenticulars are stacked may consist of a type wherein the same lenticulars are stacked and a type wherein heterogeneous lenticulars are properly combined and arranged and stacked. The type wherein the same lenticulars are stacked may consist of a type wherein the convex lenticulars are stacked and a type where the concave lenticulars are stacked. The type wherein the heterogeneous lenticulars are properly combined and arranged and stacked may consist of a type where at least one sheet of the convex lenticular and at least one sheet of the concave lenticular are arranged in a proper sequence.

It is preferred that the lenticular of the lenticular system of the present invention comprises in at least a portion the vertical light lenticular. The vertical lenticular comprises a convex vertical light lenticular or a concave vertical light lenticular. The combination or arranging sequence of the stacked lenticulars are designed based on each situation, so they may be applied in various forms. When stacking the convex or concave lenticulars, each lenticular may be directly stacked or may be turned inside out and stacked. In the lenticular system of the present invention, in ordinary occasions, the convex lenticular is disposed on the upper most portion, but alternatively the concave lenticular may be also disposed there. It is common that the concave lenticular is disposed below the convex lenticular. The number of the concave lenticular is at least one. When it needs to disperse the light of the condensed linear light source into more lines, the number of the concave lenticulars is increased.

When the stepper with the linear light source generator according to the present invention is manufactured, the linear light source generator is disposed on top of the pattern film or the photo mask. For the same of continuous light exposure work, during the light exposure work, it is preferred that the linear light source generator is spaced apart by a predetermined interval from the pattern film or the photo mask, thus obtaining a relative transfer without any friction.

Figure 2:
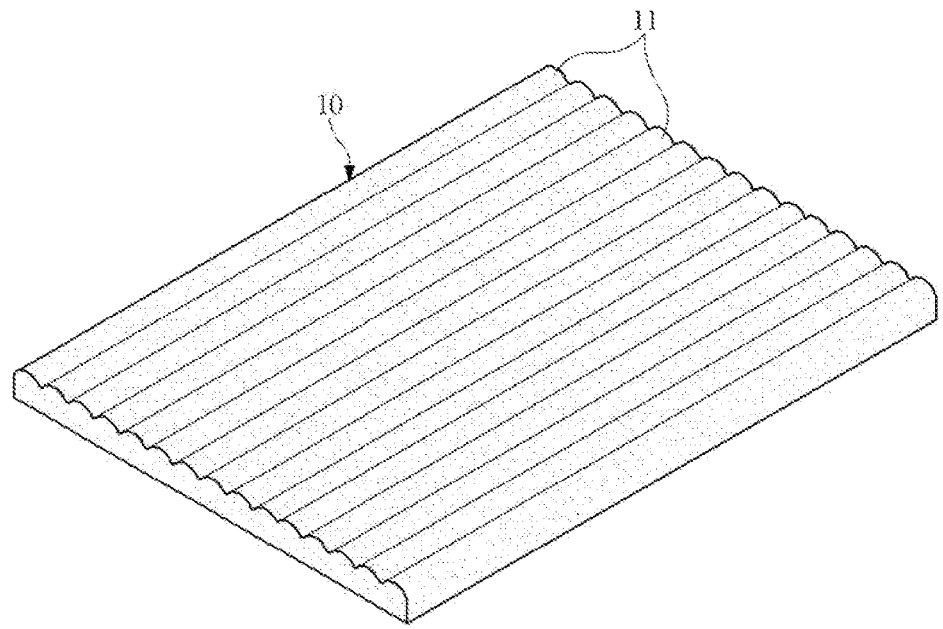
FIG. 2 is a perspective view illustrating a related convex lenticular.

FIG. 2 is a perspective view illustrating a common convex lenticular. As illustrated in FIG. 2, the convex lenticular 10 is shaped like cylinders each having a barreled portion are continuously connected. In the convex lenticular, a plurality of convex lenticular lenses 11 are continuously connected in a lateral direction. Each convex lenticular lens is shaped like a longitudinal cylinder.

The convex lenticular looks like a plurality of convex lenticular lenses are connected in a lateral direction. Each convex lenticular is formed in a cylinder shape at one side surface of which a plane is formed and at the other surface of which a barreled portion is formed. The light of the light source is condensed in a shape of line by each convex lens of the convex lenticular. The above-mentioned convex lenticular is generally used for the recording or playback of the 3D images.

Figure 3:
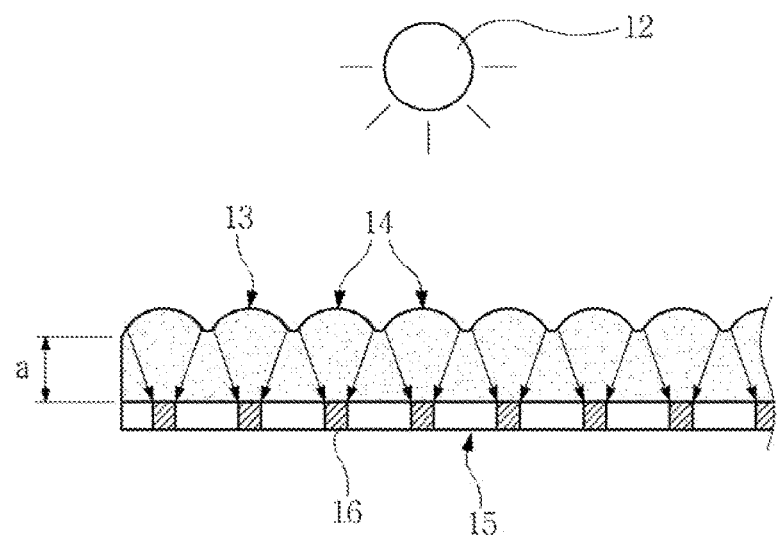
FIG. 3 is a view illustrating a state that light is condensed by a convex lenticular.

FIG. 3 is a view illustrating a state that the light of the light source is condensed through the convex lenticular. Each of the convex lenticular lenses 13 and 14 serves to condense the light of the light source 12. When the light is scanned in a state that the photo-resist is in close contact with the lower side of the convex lenticular, the condensed light light-exposes the photo-resist layer 15 in the shape of line. The condensed light forms the light exposure unit 16. On the photo-resist later, the light exposure unit and the non-light exposure unit are formed in a shape of lines.

As illustrated therein, when the light of the light source 12 is scanned, the light is condensed toward the focus of each of the lenticular lenses 13 and 14. When a predetermined change is provided to the curvature of the lens, the focal distance of the lens changes. It is possible to adjust the light condensed at the photo-resist layer 15 by adjusting the focal distance of the convex lenticular. The condensing intensity of the lens can be adjusted based on such characteristics. On the photo-resist layer, the light exposure unit 16 is formed by means of the condensed light.

Figure 4:
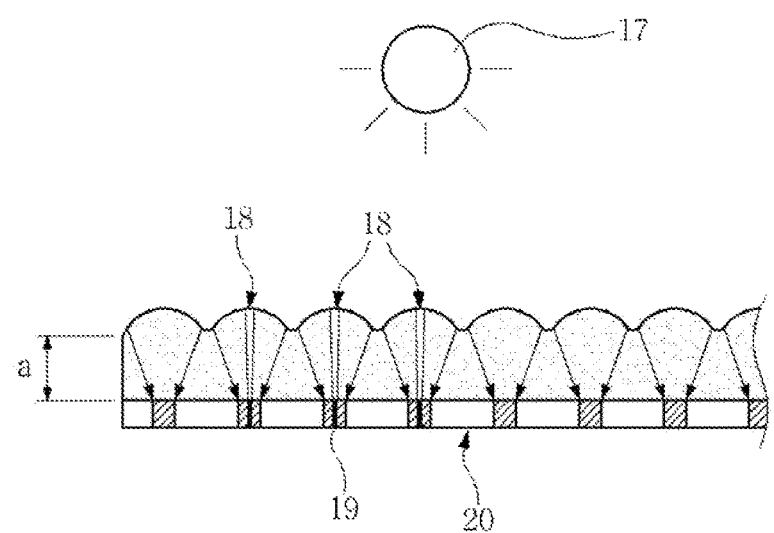
FIG. 4 is a view for describing a vertical light of a convex lenticular.

FIG. 4 is a view illustrating a vertical light state which occurs at the center of each lens of the convex lenticular. The convex lenticular is configured to condense light through the curved surface of each lens toward the focus by reflecting the light from the above. At this time, the light scanned onto the portion near the core center of each lenticular lens has small reflection. More specifically, the light travels downward in almost vertical direction while slightly reflecting. The more the light deviates from each core center of the convex lenticular lens, the more the light is reflected and is condensed toward the focus. The light condensing phenomenon occurs by means of such a reflection operation. The more the light deviates out of the core center of each lens, the greater the reflection angle increases.

In the convex lenticular, the portion where the light travels downward in an almost vertical direction in a state that the reflection of the light is very small is called a vertical light region. The vertical light region corresponds to the region being in proximity to the center of each lens of the convex lenticular.

What the convex lenticular is formed by only the region being in proximity to the center of each lens of the convex lenticular is defined as a vertical light lenticular. In the vertical light lenticular, the light travels downward in an almost vertical direction; however there is a little reflection as well. Since the reflection exists in the vertical light lenticular, the light condensing function can be performed. For this, it is possible to express like the light travels downward in an almost vertical direction as compared to the typical lenticular. In the present invention, it should be understood that there is a little reflection in the vertical light lenticular, but the intensity of the reflection is relatively very small.

In the present invention, for the sake of easier understanding, the convex lenticular is made by cutting only the regions being in proximity to the center of each lens of the convex lenticular and connecting them. Here, the vertical light lenticular performs a function of condensing the light from the light source and transferring it downward in an almost vertical direction. In the present invention, the region of the center of the convex lens lenticular does not precisely mean only the core center of the convex lenticular. The region of the center of the convex lens lenticular should be understood as including the regions 18 of the right and left small portions about the core center.

The region 18 of a certain range being in proximity to the center of the convex lenticular lens serves to condense the light of the light source 17 and let it to travel downward in an almost vertical direction. In the region 18 of a certain range being in proximity to the core center of the convex lenticular lenses, reflection is minimized. The light scanned onto the above region is condensed and travels downward in a vertical direction.

The light which passes through the region being in proximity to the center of the lenses of the convex lenticular and are condensed in an almost vertical direction and are scanned is called a vertical light in the present invention. In addition, the region of the lens of the convex lenticular which allows the light to be condensed in an almost direction and travels downward is defined as a vertical light region 18 in the present invention. A predetermined range being in proximity to the core center of the convex lenticular lenses becomes a vertical light region. The vertical light lenticular is also the object sought to be protected by the present invention.

In the present invention, the vertical light represents a light traveling in an almost vertical direction which means that it is not a perfect vertical direction. The vertical lenticular is a representative embodiment of the lenticular system used in the linear light source generator of the present invention. In the stepper of the present invention, various types of convex or concave lenticular may be used, and the most effective one is a vertical light lenticular. In the stepper of the present invention, various types of lenticulars may be used in addition to the vertical light lenticular.

In order to obtain a linear light source having a micro-sized line width, the pitches of the used lenticular must be fine. In a preferred embodiment, when the pitch of the vertical light convex lenticular was 30 microns in size, the line width of the linear light source was 3 microns in size. Using such as lenticular system, it is possible to implement a micro-sized circuit whose pitches are 20 microns in size. In the lenticular, it is possible to know that the efficiency of the linear light source generator changes in accordance with the sizes of the pitches of the lenticular and the focal distance. The vertical light lenticular having very fine pitches may be manufactured by various methods. The various methods for fabricating the vertical light lenticular will be described below.

As an embodiment of the present invention, one lens or a few lenses belonging to the vertical convex lenticular are processed by a bite or laser. The vertical light convex lenticular lens is formed of only the region being in proximity to the core center of the convex lenticular. After the process, it is copied and connected, thus fabricating a vertical light lenticular. The pitches of the vertical light lenticular are significantly smaller than the sizes of the pitches of the common convex lenticular because the convex lenticular is formed by using only the regions being in proximity to the core center of the lenses of the convex lenticular. It is possible to process the circuit substrate having a few microns in size of the pitches only when the pitches of the vertical light lenticular are below a few tens of microns in size.

Figure 5:
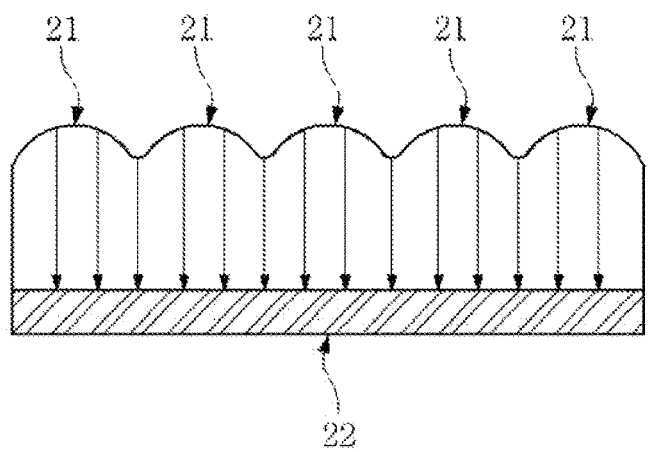
FIG. 5 is a view for describing a vertical light lenticular.

FIG. 5 is a view for describing the construction of the vertical light lenticular according to the present invention. In the present invention, the vertical light lenticular ma be constituted in various types of embodiments. FIG. 5 illustrates a construction made by connecting only the vertical light regions 21 of each convex lenticular, which is a representative form of the vertical light lenticular according to the present invention. The light of the light source positioned on the top passes through the vertical light lenticular of the present invention and is transferred downward in an almost vertical direction.

Figure 6:
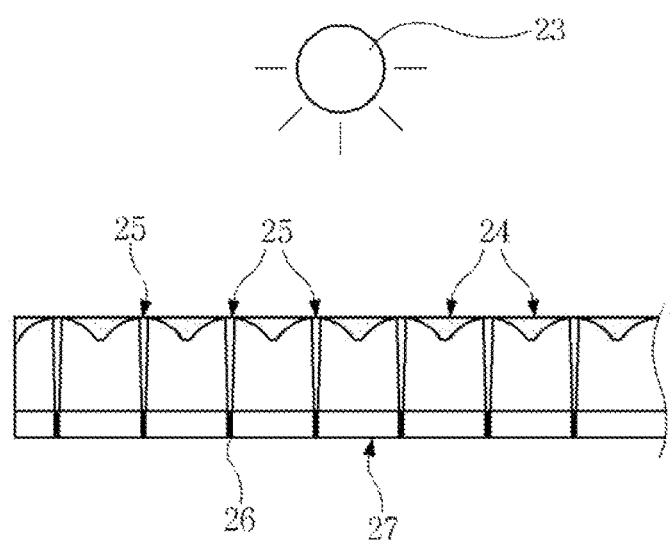
FIG. 6 is a view for describing a vertical light lenticular which forms a lens shield component.

FIG. 6 is a view for describing the vertical light lenticular which implements the vertical light by forming a lens shield component at the convex lenticular, which is an embodiment of the vertical light lenticular of the present invention. In each convex lenticular lens, the nontransparent shield unit 24 is filled into the portion except for the vertical light region 25, for thereby blocking the passing of the light. In the lenticular lenses, a vertical light lenticular is provided at a portion except for the vertical light region by a method for filling the nontransparent shield unit. If the photo-resist is provided beneath the vertical light lenticular, the light scanned through the vertical light region 25 of the lenticular lens, thus forming the light exposure unit 26.

Figure 7:
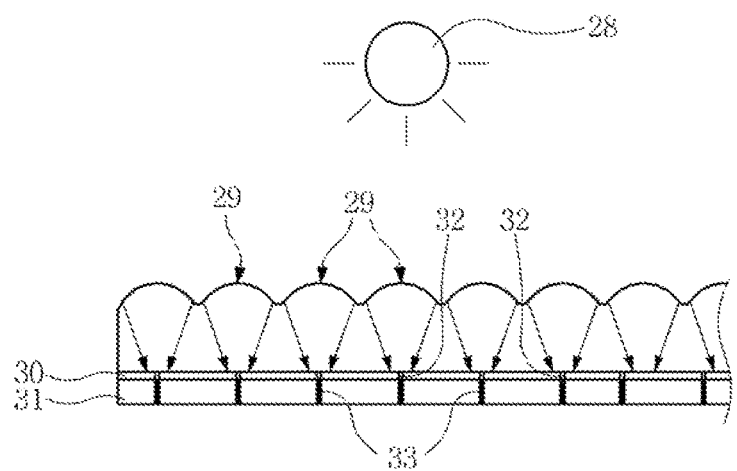
FIG. 7 is a view for describing a vertical light lenticular wherein a light transmission slit is formed.

FIG. 7 is a view for describing the vertical lenticular formed by installing a light transmission slit at the convex lenticular. In the present embodiment, a light transmission slit is formed at a lower side of the convex lenticular. The light transmission slit is formed at a lower side of the core center of each convex lenticular lens 29. The light transmission slit is configured to let the light pass through only the region of the lower side of the core center of the convex lenticular lens 29. Here, the light transmission slit may be formed in such a way to form at the nontransparent plate a long groove along a longitudinal direction of each lenticular lens.

It is manufactured using the film wherein the light transmissions slit is formed, and a transparent unit is formed at the film so that the light can pass through only the region of the lower side of the core center of the convex lenticular lens 29. When the light condensed through each lens 29 of the convex lenticular is transferred downward, only the light allowed to pass through the light transmission slit travels downward. If the photo-resist remains at the lower side of the light transmission slit, the condensed light is scanned onto the photo-resist layer 31, thus forming a light exposure unit 3. The light transmission slit is supported by means of a slit support unit 30.

As further another embodiment of the vertical light lenticular of the present invention, the lenticular may consist of both the shield unit of FIG. 6 and the light transmission slit of FIG. 7. In the present invention, a vertical light may be formed at part of the lenticular. Here, the lenticular is called a vertical light lenticular. Generally speaking, the lenticular is constituted by connecting a great number of the lenticular lenses. As long as the number of the lenses of the lenticular is at least one, it may be called a lenticular in the present invention. Therefore, as long as the number of the lenses of the lenticular is one, it belongs to the present invention. The more the number of the lenticular lenses is, the easier the light exposure work becomes. The more the number of the lenticular lenses is, the shorter the time of the light exposure becomes. In the embodiment of the present invention, it is possible to more efficiently induce efficient application of the light using the Fresnel lens, which features also belongs to the scope of the present invention. The concept of the linear light source generator sing one lenticular of the present invention is very important. The linear light source generator of the present invention must use the lenticular. The linear light source generator of the present invention comprises a light source and a lenticular system. According to a representative embodiment of the present invention, the light source and the lenticular are mounted at one container.

In the present invention, the light source comprises a LED light source. Various types of light sources may be used. It is preferred that the light source is uniformly scanned onto the whole areas of the lenticular system. In order to implement the light having uniform distribution, the present invention may be constituted in such a way that in the plane being parallel with the lenticular system, the light source fluctuates in forward and backward or/and leftward and rightward directions. In order to adjust the intensity of the light, it needs to move the light source upward and downward so as to adjust the distance with respect to the lenticular system. As a method for adjusting the distance, a screw may be used or other various methods may be used. Small vibration may be generated by providing a vibration unit at the lenticular system.

The lenticular system of the present invention comprises at least one convex lenticular or at least one concave lenticular. At least one convex lenticular and at least one concave lenticular may be concurrently included. It is preferred that the lenticular system comprises at least one vertical light lenticular. In the present invention, it is preferred that all the lenticulars of the lenticular system is formed of the vertical light lenticular. The vertical light lenticular means a convex vertical light lenticular or a concave vertical light lenticular.

The lenticular system comprises at least one convex lenticular formed of a nontransparent shield unit. The lenticular system comprises at least one lenticular formed of a light transmission slit. The lenticular system comprises at least one lenticular formed of a light shield unit.

The linear light source generator of the present invention comprises a light source and a lenticular system. A representative type of the present invention is when the light source and the lenticular system don't relatively move against each other, but are fixed. As another embodiment, the linear light source generator comprises a light source and a lenticular system, and the light source and the lenticular system are mounted at the same linear light source container.

In the present invention, when the lenticular system is formed of one sheet of the convex lenticular, below the lenticular system, there are formed the lines as many as the number of the convex lenticular lenses. Namely, when one sheet of the convex lenticular is used, the number of the lines of the linear light source corresponds to the number of the convex lenticular lenses.

The terms which define the size of the linear light source generator will be described below. The size of the linear light source generator will be described while comparing with the size of the linear light source generator. In the lenticular system, the size in the longitudinal direction of the lenticular lens is defined as the length of the lenticular system and is also defined as the length of the linear light source generator. The size of the lenticular system in a direction vertical to the length of the lenticular lens is defined as the width of the lenticular system and is also defined as the width of the linear light source generator. During the light exposure work, the linear light source generator performs a relative transfer movement in the widthwise direction of the lenticular lens, namely, in the widthwise direction of the linear light source generator.

When letting the stepper of the present invention to perform the light exposure work of large area, the length of the linear light source generator must be long, and the transfer distance in the widthwise direction of the linear light source generator must be long. Since the transfer work is possible in the widthwise direction of the linear light source generator, the large area light exposure work is possible even when the width of the linear light source generator is small. The length of the linear light source generator of the present invention, namely, the size of the lengthwise direction of the lenticular lens may be made longer when manufacturing the lenticular. So, the light exposure work can be easily performed with respect to the large area.

The embodiments of the sizes of the linear light source generator of the present invention will be described.

If the sizes of the substrate to be light-exposed is 1 meter in a horizontal direction and 200 meters in a vertical direction, the linear light source generator is manufactured in such a way that the width of the linear light source generator is about 10 cm and the length of the same is a little larger than 1 meter. At this time, the transfer distance requires at least 200 meters.

The linear light source generator of the present invention necessarily requires a relative transfer against the pattern film during the light exposure work. In the stepper of the present invention, the lenticular system is disposed at the lower most portion of the linear light source generator and on the top of the pattern film or the photo mask. In order for the pattern film or the photo mask and the linear light source generator to move without any friction, it is preferred that the pattern film or the photo mask is spaced apart by a predetermined distance from the linear light source generator.

In the linear light source generator of the present invention, during the light exposure work, the light exposure unit of a large area may be formed based on the relative transfer against the pattern film or the photo mask. In the present invention, such a relative transfer may be implemented in various types. As a specific embodiment, the occasion that the linear light source generator moves, and the pattern film is fixed together with the table of the stepper will be described. At the linear light source generator, there are formed a rail unit and a driving unit. The driving unit comprises a driving motor with a driving gear, and the rail unit comprises a rack gear engaged to the driving gear.

The linear light source generator of the present invention uses a light condensing function of the lenticular. The stepper of the present invention most greatly uses the light condensing function of the vertical convex lenticular, so even when the thickness of the photo-resist is over a few tens of microns in size, and the pitches of the light-expose circuit width are a few microns in size, clean light exposure is possible. Since the clean light exposure is possible, it is possible to constitute the clean circuit without any defects. In particular, when the linear light source generator of the present invention uses a vertical light lenticular, the vertical light from the linear light source generator is capable of most greatly preventing the scattering, diffraction and reflections of the light.

The linear light source generator using the lenticular of the present invention comprises as a basic component a light source and a lenticular system. The type of the lenticular system consists of the following two types. First, it is formed of one sheet of the lenticular. Second, a plurality of lenticulars are stacked into a stacked assembly. Here, the stacked lenticular assembly is made in such a way that convex lenticulars or concave lenticulars are properly combined and arranged.

As the most representative embodiment of the lenticular system, at least one concave lenticular may be stacked at a lower side of the convex lenticular. The type of the lenticular system consists of a type wherein at least one sheet of only the concave lenticular is stacked and variously stacked types.

When the present invention uses a lenticular system wherein the convex lenticulars and the concave lenticulars are stacked, it is possible to perform a light exposure of the circuit having finer pitches during the light exposure work. When the stacked lenticular is used, it is possible to make the linear light source wherein the line width of the linear light source is a few tens of nanometers in size. When the linear light source having a few tens of nanometers in size of line widths is canned onto the pattern film, a light exposure work having a few microns in size of the circuit width may be possible.

The convex lenticular and the concave lenticular will be described below.

The lenticular is generally made from a transparent material, wherein one side is plane, and the other side is formed of a convex lens or a concave lens. The concave lens or the convex lens are continuously arranged in a shape of a cylinder. The concave lenticular used in the present invention may be defined as follows. The concave lenticular is made from a transparent material, wherein one side is formed of a plane, and the other side is formed of a concave lens, thus forming a cylinder which is continuously arranged.

Figure 8:
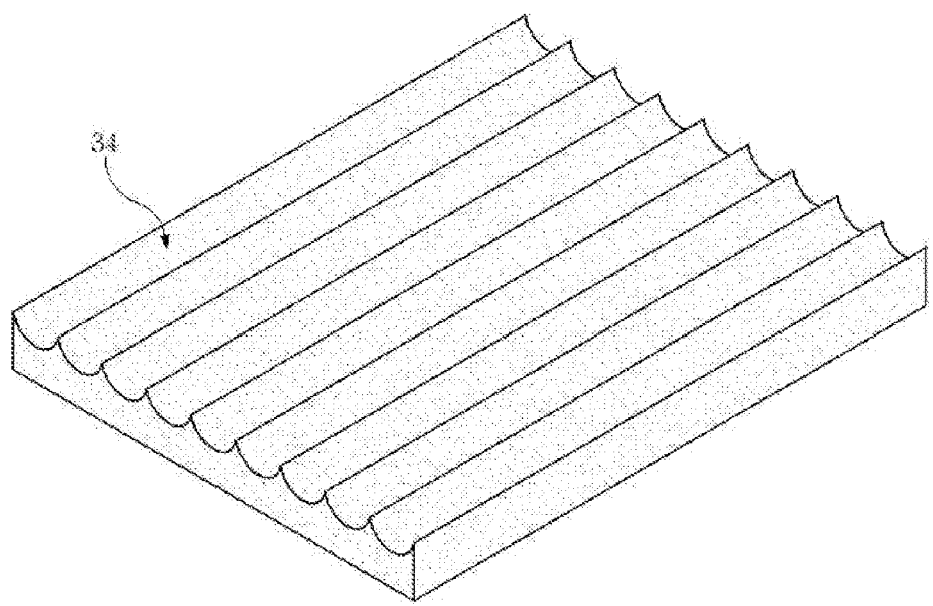
FIG. 8 is a perspective view illustrating a related concave lenticular.

FIG. 8 is a perspective view of the concave lenticular. The convex lenticular is configured in such a way that the convex lens cylinders are continuously connected. For this, the concave lenticular 34 is correspondingly formed in such a way that the concave lens cylinders are continuously connected. The light is condensed through the convex lenticular, and the light is dispersed through the concave lenticular into a plurality of lights. The lenticular system of the present invention may be constituted in such a manner that at least one convex lenticular is arranged or at least one concave lenticular is arranged or at least one convex lenticular and at least one concave lenticular are stacked into a stacked assembly.

It is obvious that with one sheet of the convex lenticular, it is possible to form the lenticular system of the present invention. In the lenticular system of the present invention, the convex lenticulars and the concave lenticulars may be stacked in various sequences. Different effects may be obtained based on the stacking sequence and method. Since the stacking sequence greatly affects the performance of the stepper, it needs to design based on each situation.

Figure 9A:
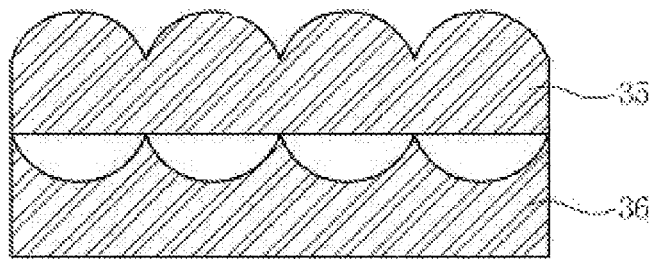
FIGS. 9A, 9B and 9C are views illustrating examples of a lenticular system.
Figure 9B:
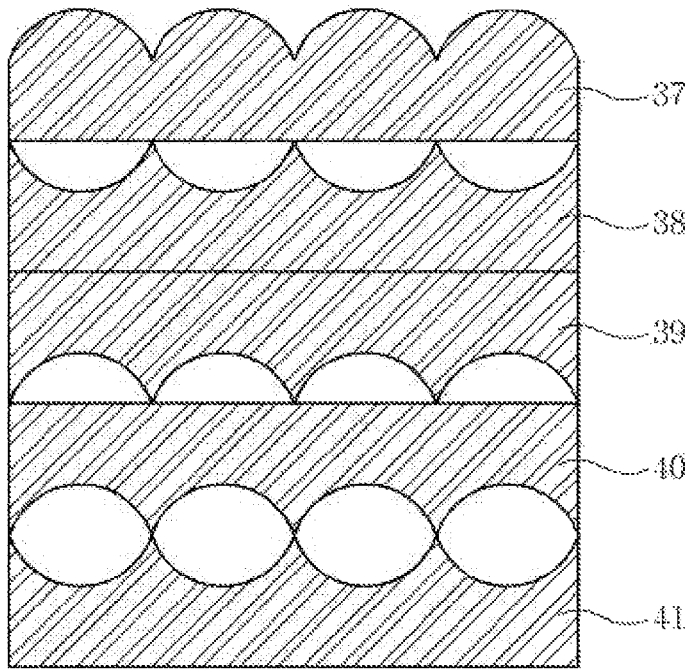
Figure 9C:
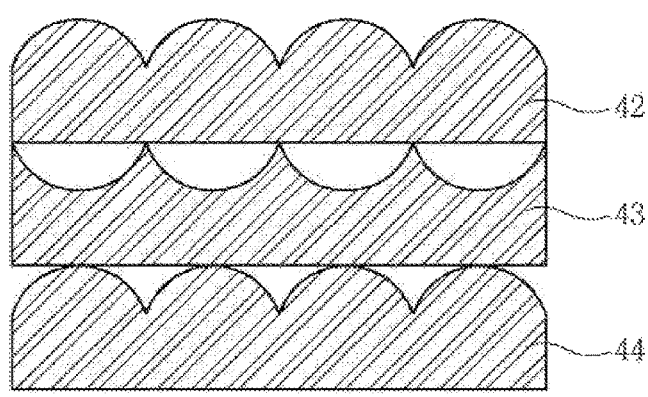

FIGS. 9A, 9B and 9C are views illustrating the embodiment of the lenticular system, of which FIG. 9A is a view illustrating a state that the concave lenticulars are stacked beneath the convex lenticular. The convex lenticular lens works like the convex lens, and the lens of the concave lenticular works like the concave lens. In the concave lenticular, the center of the concave portion is called a valley in the present invention.

FIG. 9B is a view illustrating a state that four concave lenticulars 38, 39, 40 and 41 are stacked beneath the convex lenticular 37. When the concave lenticulars are turned inside out and stacked, another effect may be obtained. The performance of the lenticular system may be changed based on the change in the type wherein the convex lenticulars are stacked at the lower most portion.

FIG. 9C is a view illustrating an embodiment wherein the concave lenticulars are arranged beneath the convex lenticular, and the convex lenticulars 44 are arranged beneath the concave lenticular 43.

What the light condensed by the convex lenticular is dispersed by means of the concave lenticular will be described. The concave lenticular serves to disperse the light of the linear light source. When the convex lenticular is placed on top, and the concave lenticular is staked at the lower side, the light scanned from the light source is transferred to the concave lenticular in a form of the line-shaped light with the same number of lines as the number of the convex lenticular lenses. The light of the line shape disperses by means of the concave lenticular lens of the lower side.

The line-shaped light having the same line number as the number of the lenses of the convex lenticular may disperse into more number of line-shaped lights by means of the concave lenticular positioned at the lower side. The linear light source generated by the concave lenticular is dispersed into more number of linear light sources. The light is dispersed into more number of linear light sources by means of the concave lenticular, and at the same time, the line width of the linear light source becomes thinner. The linear light source with thinned line widths passes through the pattern film along with less diffraction and interference.

The above-mentioned phenomenon means that it is possible to more finely light-expose the light exposure layer of the substrate. The light condensed and dispersed by the stacked lenticulars are has the following features. First, the line width of the linear light source is thinned, and second the number of the linear light source increases. Since the present invention uses the light which is condensed and dispersed by the lenticular system, finer light exposure work is possible. The linear light source made through the lenticular system of the present invention may make the line-shaped light having tens or hundreds of nanometers in size of line widths.

Figure 10:
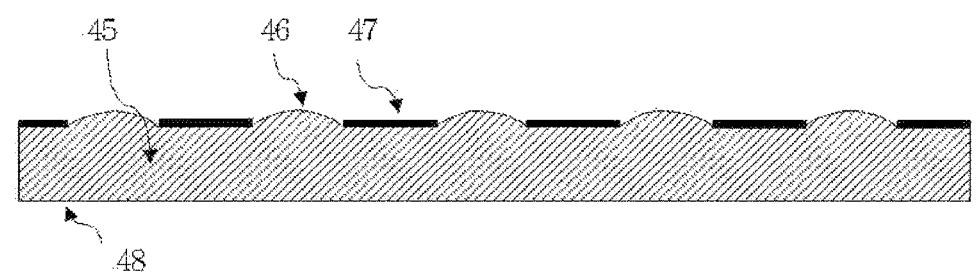
FIG. 10 is a view illustrating a construction of a convex lenticular which includes a light shield unit.

FIG. 10 is a view illustrating a construction of a vertical light convex lenticular with a light shield unit. In the present invention, it is possible to make tens or hundreds of nanometers in size of linear light source through the stacked lenticular system. However, in this case, the interval between the neighboring linear light source which has passed through the lenticular system may be too narrowed. When the linear light sources are too close and dense, non-preferred phenomenon may occur. When the intervals between the neighboring line-shaped lights are too narrowed, they might become stuck to each other.

Due to the above problems, when the linear light source passes through the pattern film, interference and diffraction may occur in light, which makes impossible the precise light exposure work. In order to prevent the neighboring linear light sources from sticking to each other, as illustrated in FIG. 10, a light shield unit 47 is provided between the convex lenticulars 46 so as to block the flow of the light.

In the present invention, irrespective of the convex lenticular and the convex lenticular, a light shield unit may be provided so as to prevent the light from penetrating into between the lens and its neighboring lens. The formation of the region for blocking the entry of the light in the lenticular is defined as a light shield unit in the present invention. The light shield unit forms a flat plane portion between the lens and the lens, and a nontransparent unit may be printed thereon by a printing method or a flat plane portion may be formed between the lens and the lens. The pattern film which forms the nontransparent unit on the plane portion may be manufactured and attacked. The thusly constituted lenticular is defined as a lenticular 45 with a light shield unit in the present invention.

Figure 11:
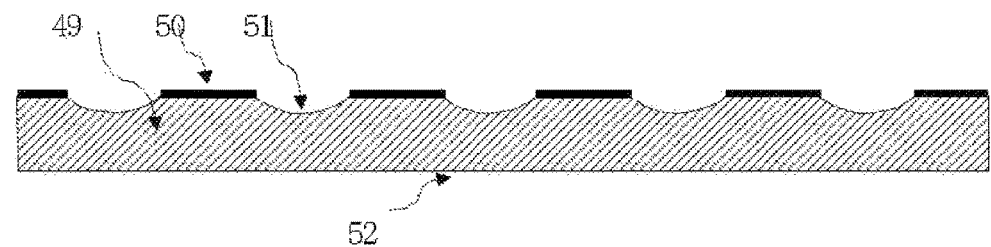
FIG. 11 is a view illustrating a construction of a concave lenticular which includes a light shield unit.

FIG. 11 is a view illustrating a construction of the concave lenticular equipped with the light shield unit, the construction of which corresponds to the convex lenticular with the light shield unit. In the concave lenticular 49 with the light shield unit 50, the light shield unit 50 is disposed between the concave unit 51 and the concave unit.

Figure 12:
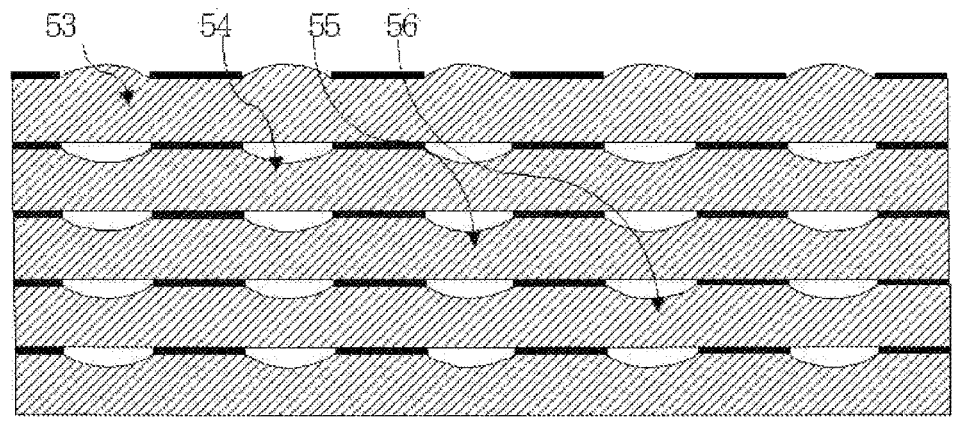
FIGS. 12 and 13 are views illustrating another embodiment of the lenticular system which includes a light shield unit.

FIG. 12 is a view illustrating a lenticular system with a light shield unit according to further another embodiment of the present invention. The convex lenticular 54 with the light shield unit and the concave lenticulars 54, 55 and 56 with the light shield units are stacked for thereby forming a lenticular system with the light shield unit.

Figure 13:
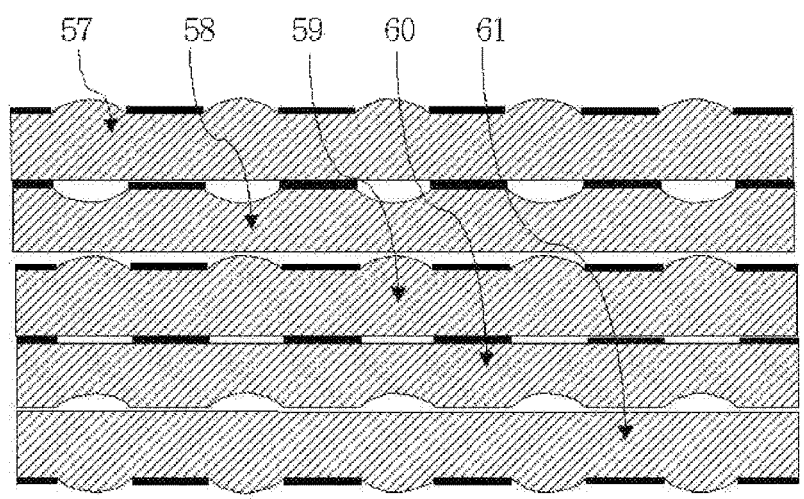

FIG. 13 is a view illustrating another lenticular system with a light shield unit formed by stacking the convex lenticulars 57, 59 and 61 with the light shield unit and the concave lenticulars 58 and 60 with the light shield unit. This construction has an advantage in the way that the linear light sources generated by the lenticular system are spaced apart. The lenticular system with a light shield unit may be implemented in various forms, for example, by combining the convex lenticular with the light shield unit or/and the concave lenticular with the light shield unit.

The lenticular system used in the linear light source generator is sought to be protected in the present invention. The lenticular system of the present invention may be formed of one lenticular or a lenticular-stacked assembly. In case of the lenticular-stacked assembly, at least one convex lenticular is included or at least one concave lenticular is included or at least one convex lenticular and at least one concave lenticular are stacked into a stacked assembly.

The lenticular system of the present invention may comprise a vibration unit. The lenticular system of the present invention may comprise at its part a vertical light lenticular. As the kinds of the vertical light lenticular, there are a vertical light lenticular and a vertical light concave lenticular. The typical lenticular may comprise a nontransparent shield unit or a light transmission sit or a light shield unit so as to constitute a vertical lenticular.

In the present invention, the lenticular system is necessary to maintain a flatness. In order to maintain the plane of the lenticular, it may be supported by a transparent plate such as a glass plate, etc. Since the lenticular system is thin, it may be flexible. The most representative embodiment of the transparent plate for maintaining the flatness is a glass plate. On the top or bottom or both the top and bottom of the lenticular system, the transparent plate is positioned so as to maintain the plane.

When the lenticular system is formed in the stacked assembly, the lenticulars are not moved against each other. It is preferred that they are integrally bonded. The bonding is performed at an edge portion of the lenticular, not on the whole surfaces of the lenticular. The bonding may be implemented in various forms. As the most representative embodiment, it may be bonded by a ultrasonic wave bonding or a UV resin bonding. When forming the bonding portion, it is preferred that the boding unit is processed under the vacuum environment so as to prevent any formation of the gap at the stacked portion of the lenticulars.

The stepper with the linear light source generator which uses the lenticular according to the present invention will be further described below.

The stepper with the linear light source generator of the present invention is directed to using the lenticular. The linear light source generator comprises a light source and a lenticular system. The lenticular system is configured to move together in the same direction and at the same speed. In the present invention, what the lenticular system moves in whole in the same direction and at the same speed is defined as a co-movement structure.

The co-movement structure means that the light source and the lenticular system move at the same speed while they are in whole moving in the same directions. As the most representative embodiment of the co-movement structure, the light source and the lenticular system are mounted together on one container. The container is made in a sealed or open structure. In this case, the light source and the lenticular system are transferred in the same directions and at the same speed. The transfer direction is a direction perpendicular to the longitudinal direction of the lenticular lens.

The fluctuation movement of the light source affects a little the speed of the lenticular lens. As compared with the moving speed of the light source, the fluctuation speed of the light source is made fast, so it looks like the speed of the light source does not affect in whole. When the light source and the lenticular system are transferred for the sake of light exposure work, the system is designed so that the transfer speed of the light source is not largely affected by the fluctuation. So, it is possible to describe like the lenticular system and the light source move at the same speed in whole.

In the linear light source generator of the present invention, small vibrations may be applied by installing a vibration unit at the lenticular system. Strictly speaking, when there are provided a fluctuating light source and a vibrating lenticular system, it is impossible to judge that each component moves at the same speed. However, for the convenience, it is defined like they move at the same speed in whole.

For easier understanding, such operation is defined as a co-movement structure in the present invention. As the most representative embodiment, the light source and the lenticular system are fixed at the same container in the stepper with the linear light source generator of the present invention, and they move at the same speed without any relative movement against them. In this case, the light source does not fluctuate, and the lenticular system does not vibrate. More specifically, they move together like one body.

The characteristic of the light source is very important in the present invention. When the light source is made by attaching to the flat plate a plurality of the light emitting components like the LEDs. Strictly speaking, it is hard to say that the intensity of the light source is uniform with respect to the whole area. In case of the LED light source, there is always a gap between the neighboring LEDs. Due to such a gap, it is impossible to make uniform the intensities of the light with respect to all the area. Even under this circumference, it needs to try best to make the uniform distribution of light with respect to all the area in such a way to fluctuate the light source in the horizontal direction or/and the vertical direction over the plane same as the plane formed by the lenticular system. In order to obtain the uniformity in the light source, a fluctuation wherein repeating motions occurs for short time period is performed. For the fluctuation of the light source, repeating motions are necessary for short time period in a predetermined direction.

The intensity of the light is very important for the stepper. In order to adjust the intensity of the light, there is a representative way wherein consumed electric power amount is adjusted. As another way, there is a way to adjust the distance between the light source and the lenticular system in the linear light source generator of the present invention in order to adjust the intensity of the light. Even when the same electric power is consumed, if the distance between the light source and the lenticular system is close, the light with a stronger intensity can be scanned.

In order to adjust the intensity of the light, the distance may be adjusted in such a way to make the light source farther or closer with respect to the lenticular system. In case that the light source and the lenticular system are mounted in the same container, the lenticular system is positioned at the lower most cross section of the container. When the light source is made closer by moving the light source toward the lenticular system inside of the container, it is possible to obtain a stronger intensity of the light. In order to constitute the device capable of adjusting the distance between the light source and the lenticular system, various types of linear transfer devices may be used.

In case that the light source and the lenticular system are mounted in the same container, it needs to fix the container so as to prevent any movements of the light source and the lenticular system, so there is not any relative movement between the light source and the lenticular system. In this case, the intensity of the light can be adjusted only by adjusting the electric power used. In this case, it is assumed that there are not any fluctuation in the light source and the vibrations in the lenticular system. Even in this case, the linear light source generator may properly perform its function. The stepper wherein there is not any relative movement between the light source and the lenticular system belongs to the embodiments of the stepper of the present invention.

When the light source and the lenticular system are mounted in the same container, the container itself may be configured to move in an upward or downward direction with respect to the table of the stepper of the present invention. The upward and downward movements of the container facilitate the preparation work for the light exposure work to be performed on the table.

In the present invention, it is necessary to eliminate the heat from the light source using the cooling unit. With this, it is possible to forcibly circulate cooling air or water into the inside of the container, thus cooling it. At this time, a mechanical device for producing cooling air or water may be provided inside of or outside of the linear light source generator or may be provided under the table of the stepper.

In the stepper of the present invention, the pattern film or the photo mask are positioned under the lenticular system. During the light exposure work, the lenticular system is spaced apart by a predetermined distance from the pattern film or the photo mask. Such a distance reduces friction while enabling a smooth transfer when there is a relative movement against each other. It is preferred that such a distance is as short as possible. The substrate on which a photo-resist layer is coated beneath the pattern film or the photo mask. The substrate is spaced by a predetermined distance from the pattern film or the photo mask or comes into close contact with it. In the spaced-apart case, it is impossible to eliminate any side effects such as diffraction or interference of light.

Therefore, it is preferred that the substrate is preferably in close contact with it for the sake of precise light exposure work. However, when the pattern film or the photo mask is in close contact with the photo-resist, the pattern film or the photo mask comes into contact with the photo-resist, thus damaging the photo-resist. In this matter, it is necessary to space apart the pattern film or photo mask and the photo-resist by a predetermined distance. When spacing apart them, it is preferred that the distance is as short as possible, thus reducing any diffraction and interference of the light.

It is necessary to make them closer for the sake of precise light exposure work. When performing the light exposure work in a closely contacting state, since the light directly transfers to the photo-resist layer, side effects such as diffraction or interference of the light may be significantly reduced. Whether to space apart or closely contact them is properly selected dependent on the strictness and precision of the light exposure work.

In the lenticular system of the present invention, it is common to place the convex lenticular on the upper most layer of the lenticular system, but the concave lenticular may be placed there. Depending on the characteristics that each stepper requires, the kinds and stacking types of the lenticulars may be different. In order to constitute the most efficient stepper, it is preferred that at least one sheet of the vertical light lenticular is necessarily included. The lenticular system of the stepper of the present invention may comprise a lenticular with a nontransparent shield unit, a lenticular with a transmission slit or a lenticular with a light shield unit.

Figure 14:
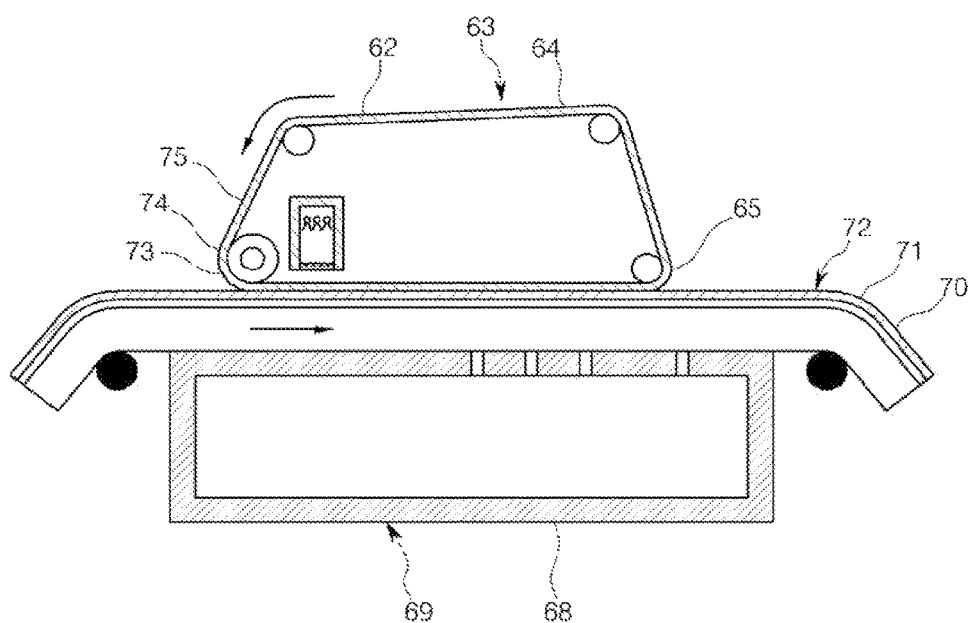
FIG. 14 is a view for describing the construction of a stepper by separating it into upper and lower structures according to the present invention.

FIG. 14 is a view for describing the concept of the upper and lower structures of the stepper of the present invention, which is to additionally describe the structure of the stepper of the present invention. The upper structure may comprise a compression roller 74 surrounded by an elastic unit 73, and a linear light source generator 75. There may be further provided auxiliary rollers 62, 64 and 65. The compression roller 74 and the linear light source generator 75 are transfer in cooperation with each other.

The compression roller is provided in front of the linear light source generator, thus making the pattern film 63 come into close contact with the substrate 70. In this way, the light exposure work is performed with the linear light source from the linear light source generator in a state that the pattern film and the substrate are in close contact with each other. The lower structure comprises a table 69 for positioning the substrate 70, and a close contact unit 68 configured to make the substrate come into close contact with the table. According to the stepper illustrated in this drawing, it is designed in such a manner that the table and the upper structure are fixed, and during the light exposure work, the substrate and the pattern film are transferred.

The substrate 70 on which a thin photo-resist layer 72 is uniformly coated is detachably disposed at the table 69 of the stepper. On the substrate, the pattern film 62 is positioned. During the light exposure work, the upper structure with the linear light source generator must be transferred relatively against the table of the lower structure. In case that the pattern film moves integrally with the table of the lower structure, it needs to install a transfer unit at either the upper structure or the lower structure.

A cooling unit configured to cool the heat from the light source of the linear light source generator is disposed at either the upper structure or the lower structure. The cooing air or water produced by the cooling unit serves to cool the heat from the light source of the linear light source generator. The pattern film is compressed onto the substrate by means of a compression roller.

The substrate may come into close contact with the table by means of the close contact unit. There may be provided a close contact unit configured to make the substrate come into close contact with the table by means of the vacuum pressure of the vacuum pump through the small holes after the small holes are formed on the table. For the reparation of the light exposure work, the upper substrate is constituted to move in the upward and downward directions with respect to the table. In the process for preparing the light exposure work, it may need to move the upper substrate upward from the table.

In the stepper of the present invention, the types of the pattern film may be various. Generally speaking, the pattern film on the individually separated sheets is mainly used. As another type, it may be made in an endless track wherein the start portion and the end portion of the pattern film are connected. Such an endless track type method is advantageous for the mass production. In case of the pattern film forming the type of an endless track, the linear light source generator is positioned inside of the pattern film.

When the pattern film of the endless track type is not used, the upper structure performs a light exposure work at the initial position and moves in a state that it is spaced apart from the lower structure and then returns to its initial position, through which repeating procedure, the light exposure work can be repeatedly performed.

At an end of both sides or one side of the table of the stepper of the present invention, there may be provided a reel structure for winding the flexible substrate. When the substrate is a nonconductive substrate, it needs to thinly sputter the surface with the conductive metal so as to form a conductive layer 71 on the substrate 70. According to the situation, the thickness of the conductive layer 71 is increased by coating on the sputtering layer.

The linear light source generator of the stepper and the pattern film much have relative transfers against with each other during the light exposure work. The movement of the pattern film may be connected to the lower structure, thus moving. In this case, when the upper structure is fixed, the lower structure may be relatively moved. If the lower structure is fixed, the upper structure may be relatively moved. The pattern film 63 on which the pattern is formed may be formed in an endless track form. The pattern film comes into close contact with the substrate by means of the compression roller 74. The pattern film and the photo-resist coated on the substrate are in contact with each other by the compression roller, so there is not any relative slip. The substrate and the table can come into close contact with each other by the close contact unit.

In case that the patter film is a form of the endless track, the linear light source generator 75 resides inside of the endless track 53. The upper structure is configured to move in the upward or downward direction, so the light exposure work such as the exchange of the substrate, etc. can be performed. As the substrate 70, a flexible substrate on which a thin photo-resist layer 72 is uniformly coated is widely used. When the flexible substrate is used, it may be wound on the reels of both sides of the table 69, so a light exposure work can be continuously performed.

When the pattern film is formed in a form of endless track, an endless continuous work is possible. The substrate made in such a way that the conductive layer (metallic) 71 is formed on a polyimide film, and the photo-resist layer 72 is uniformly coated on the metallic layer is generally used. When the pattern film is not in a form of the endless track, when a light exposure work of a predetermined range is performed, it needs to move the upper structure to the initial position. For describing the above-mentioned structure, the position where the light exposure work begins is defined as the initial position. After the light exposure work of a predetermined range is performed, a device is constituted so as to move the upper structure to the initial position in a state that it is spaced apart from the lower structure.

Figure 15:
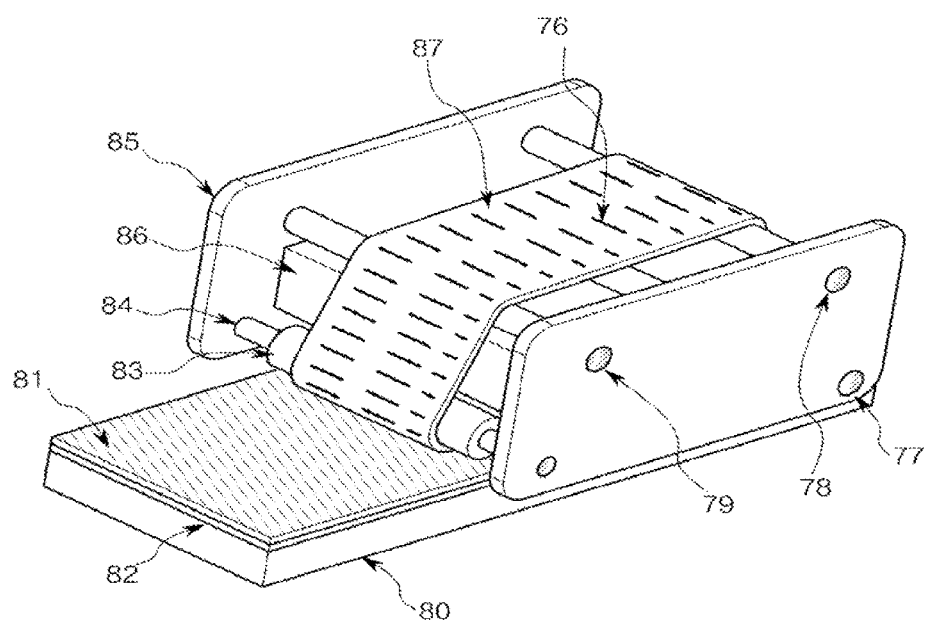
FIG. 15 is a view for describing the construction of FIG. 14.

FIG. 15 is a view for additionally describing the construction in FIG. 14. The pattern film formed of the endless track comprises a transparent unit 87 and a nontransparent unit 76. The linear light source generator 86 is positioned inside of the endless track.

The upper structure comprises a compression roller 84 supported by an elastic unit 83, at least one auxiliary roller 77, 78, 79, and a linear light source generator 86. The lower structure comprises a table and a close contact unit configured to make the substrate come into close contact with the table. The light source and the lenticular system of the linear light source generator are stably and integrally engaged by means of a support frame 86. The substrate 80 is uniformly coated with the photo-resist 81.

Figure 16:
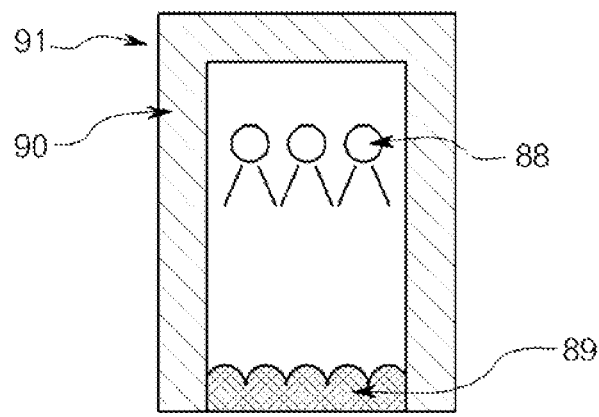
FIG. 16 is a view for describing a linear light source generator according to the present invention.

FIG. 16 is a view for describing the linear light source generator according to an embodiment of the present invention. In the present embodiment, the light source 88 and the lenticular system 89 of the linear light source generator 91 are mounted in the container 90. It is obvious that the light source may be configured to fluctuate inside of the container or move upward and downward.

Inside of the container, there may be provided a fluctuation structure configured to fluctuate the light source or a vibration structure which is configured to slightly vibrate the lenticular system. This structure is a typical equipment, so it may be constituted in various forms, thus omitting the detailed descriptions thereof. Inside of the container, it is obvious that various related equipment such as a cooling unit for cooling the heat of the light source may be further installed.

Inside of the container, there may be provided a device for allowing the light source generator to move upward and downward. In the present invention, the lenticular system is generally disposed at a lower side of the container. In order to adjust the intensity of the light source, it is possible to adjust the distance between the light source and the lenticular system.

The intensity of the light scanned onto the pattern film or the photo mask may be adjusted by adjusting the distance between the light source and the lenticular system.

Figure 17:
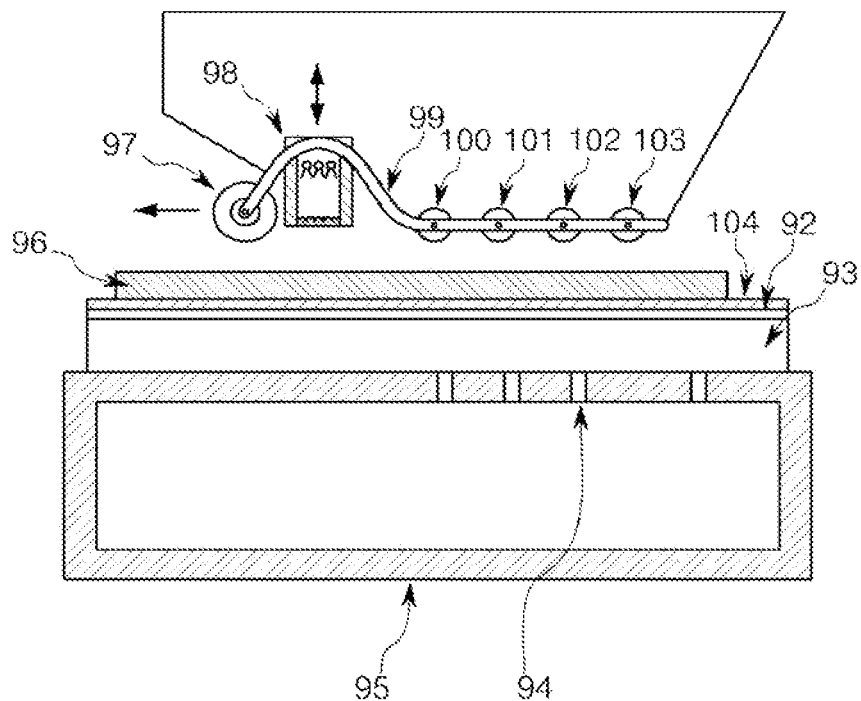
FIG. 17 is a view illustrating further another embodiment of an upper structure of a stepper of the present invention.

FIG. 17 is a view illustrating an upper structure according to further another embodiment. The upper structure comprises a compression roller 97 surrounded by an elastic unit, at least one auxiliary roller 100, 101, 102, 103 and a linear light source generator 98. The compression roller and the linear light source generator move in cooperation with each other and move in upward and downward directions with respect to the table, thus preparing for the light exposure work. The light exposure work is prepared for being performed with respect to the large area by moving leftward and rightward the compression roller and the linear light source generator. In addition, the light exposure work may be performed with respect to the large area in such a way that the pattern film and the substrate are moved leftward and rightward in a state that the compression roller and the linear light source generator are stopped.

In the present embodiment, after the light exposure work is performed at the initial position, the upper structure is configured to return to the initial position in a state that it is spaced apart from the lower structure, thus repeatedly performing the work. A sputtered metallic later is thinly formed on the top of the substrate 93 so as to provide conductivity, and a thin coating layer 92 coated with a metal such as copper, etc. is formed on the sputtered metallic layer, and a thin photo-resist layer is formed on the thin coating layer.

In the stepper of the present invention, the light source is generally mounted in the container. The light source which may be used in the present invention is not limited to the type wherein it is mounted in the container. For example, the light of the light source may shine with respect to the whole portions of the table of the stepper of the present invention. In addition, the light of the light source may shine on the whole portions of the work room where the light exposure work is performed. In the present invention, what type the light source is formed in does not matter. As long as the light of the light source reaches the photo-resist layer through the lenticular system, such construction belongs to the scope of the present invention.

During the light exposure work, the stepper of the present invention is constituted in such a way that the light does not reach the photo-resist layer through other portions, except for the lenticular system, which is commonly applied to all the light sources in the stepper of the present invention. In the same way, when the light shines the whole area of the table or when the light source shines the whole portions of the work room, it does not obviously need to move the light source, provided that during the light exposure work, it is controlled so that the light does not reach the photo-resist layer through other portions except for the lenticular system. The lenticular system must have a relative transfer against each other with respect to the pattern film.

It is defined that the light source formed in the above way belongs to the concept of the light source of the linear light source generator of the present invention. In this case, the linear light source generator comprises a light source and a lenticular system. It is defined that the linear light source generator performs a light exposure work based on a relative transfer with respect to the pattern film.

Figure 18:
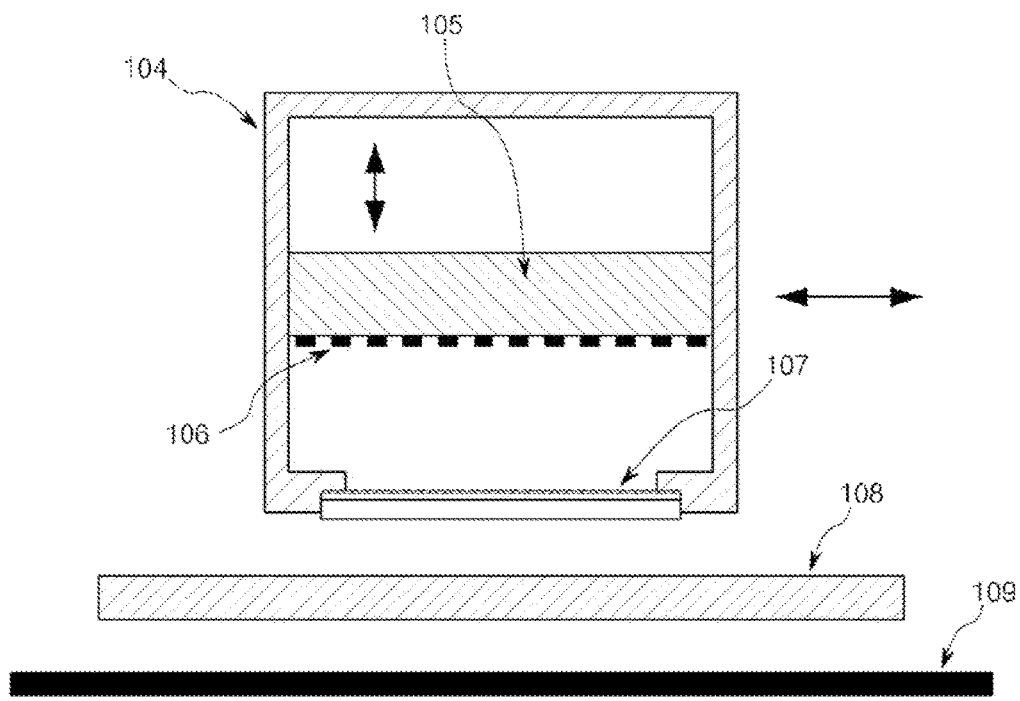
FIG. 18 is a view for describing a linear light source generator which adjusts the intensity of light inside of a container.

FIG. 18 is a view for describing the linear light source generator which is capable of adjusting the intensity of the light inside of the container. The light source and the lenticular system are mounted in the same container 104. The light source mounted inside of the container is configured to move upward and downward inside of the container.

As an embodiment of the present invention, there is an LED light source 106. The light source is generally constituted by engaging a plurality of the LEDs to a support unit. It is obvious to constitute the LEDs into a form of surface light source. What the LEDs are engaged to the support unit or the LEDs are formed in a form of surface light source is called a light source support unit 105 in the present invention.

In the present embodiment of the present invention, the light support unit is constituted inside of the container in such a way that it can move upward and downward. The lenticular system 107 is disposed below the container. The intensity of the light scanned onto the lenticular system can be adjusted by moving in upward and downward directions the light source support unit inside of the container.

The intensity of the light source used in the stepper of the present invention may be controlled by controlling the consumed electric power or alternatively may be controlled by adjusting the distance between the light source and the lenticular system. In the stepper of the present invention, the intensity of the light scanned onto the substrate and the relative transfer speed of the linear light source generator are very important factors when determining the quality of light exposure. So, the device capable of precisely controlling the intensity of the linear light source is also very important. In addition, the device capable of precisely controlling the relative transfer speed of the linear light source generator is also very important.

Figure 19:
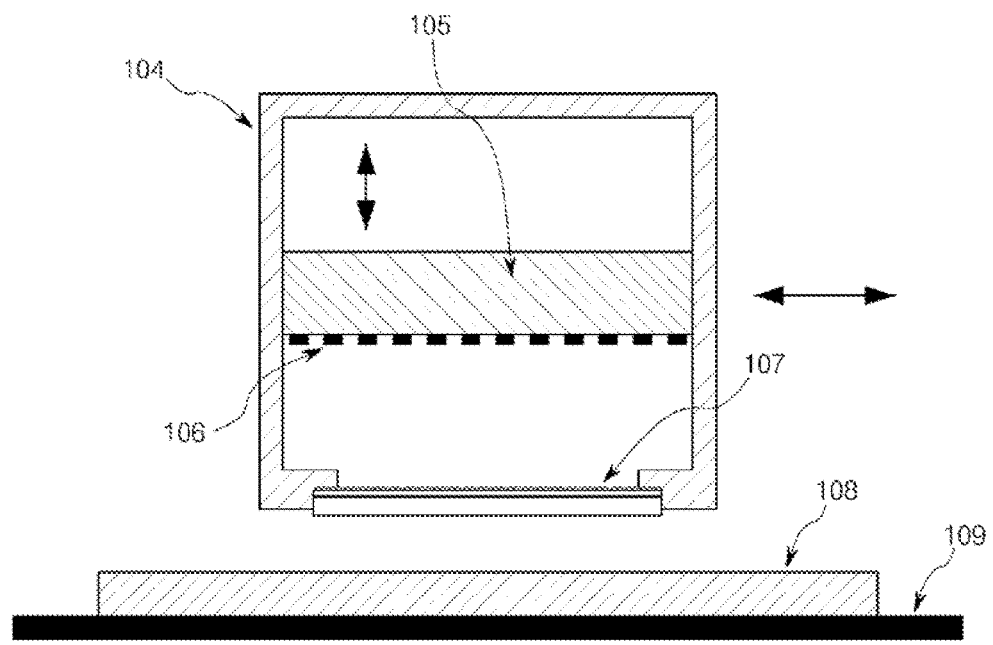
FIG. 19 is a view for describing a position relationship between a linear light source generator, a pattern film and a substrate of a stepper.

FIG. 19 is a view for describing the position relationship between the linear light source generator, the pattern film and the substrate. In the linear light source generator of the present invention, the lenticular system is disposed at a lower side of the container. The pattern film or the photo mask is positioned below the lenticular system. The substrate is disposed beneath the pattern film or the photo mask. FIG. 19 is a view illustrating an occasion that the pattern film or the photo mask 108 is in close contact with the substrate 109.

When the pattern film or the photo mask 108 comes into close contact with the photo-resist layer of the substrate, the diffraction or interference of the light is greatly reduced. So, the light exposure wok can be precisely performed. When the light exposure work is performed without peeling off the protection film formed on the photo-resist layer, the photo-resist layer is not damaged even when the work is performed in the close contacting state. However, when the work is performed with the protection film being peeled off, the damage of the photo-resist layer should be considered. At this time, it is preferred that the light exposure is performed in a state that the pattern film or the photo mask is spaced apart by a predetermined distance from the photo-resist layer.

In the lenticular system used in the present invention, the upper most portion of the lenticular system is called a convex lenticular, and beneath the convex lenticular, at least one concave lenticular is generally combined. In this case, the concave lenticular may be positioned on the upper most portion of the lenticular system according to the situation, and the convex lenticular may be positioned at the lower most portion.

The linear light source generator and the lenticular system used in the linear light source generator according to the present invention may be applied in various types to the stepper as well as the video panel of the common video device. In the typical video device, the light is transferred through the backlight and the polarization filter to the video panel. At this time, a lot of the light is lost at the time the light passes through the polarization film. However, when the linear light source generator of the present invention is used in the video device, it may substitute the functions of the backlight and the polarization filter. It is greatly advantageous that the linear light source generator of the present invention directly uses the light from the light source without any loss. When there is not any loss in the light, the service life of the battery can greatly increase. A slight vibration unit may be added to the lenticular system in order for the linear light source generator of the present invention to be used at the common video panel.

A slight vibration unit configured to generate small vibrations is engaged to the lenticular system, thus eliminating any empty portion between the linear light sources, which occurs at the linear light source generator. The intervals between the linear light sources is at most a few microns in size or a few tens of microns in size. The empty portion formed due to the interval between the linear light sources may be resolved by means of the small vibrations of the lenticular system. The watcher does not feel any empty spaces thanks to optical illusion.

In the present invention, the method for generating the micro-sized linear light source belongs to the scope of the present invention. The method for generating the micro-sized linear light sources of the present invention is characterized in that the micro-sized linear light source is generated by allowing the light from the light source to pass through the lenticular system which has fine pitches. In order to generate the micro-sized linear light source, the pitches of the lenticular should be micro-sized. It is preferred that the lenticular system comprises a vertical light lenticular.

The above-mentioned fine linear light source means that the line width of the linear light source is fine and the sizes of the line width range from a few tens of nanometer sizes to a few tens of microns in size. As a result of the experimental value of the present invention, in order to obtain a ling width of the linear light source of 700 nanometer sizes, the vertical light convex lenticular of whose pitches are 33 microns in size is used. 8 sheets of concave lenticulars are stacked beneath the vertical light convex lenticular.

In addition, in order make the linear light source having a line width of 3 microns in size, the vertical convex lenticular whose pitches were 30 microns in size and the lenticular system wherein one sheet of the concave lenticular was stacked beneath the vertical light convex lenticular were used. The light exposure work of large areas was fast completed using the linear light source generator wherein the line width of the linear light source was 3 microns in size. As a result of the light exposure work performed using the stepper having the linear light source whose line width was 3 microns in size, it was possible to fast complete the light exposure for the large area with respect to the substrate wherein the width of the stepper was 10 microns in size, the width of the non-light exposure was 10 microns in size, and the thickness of the photo-resist layer was 15 microns in size.

In the lenticular system of the present invention, even when the pitches of the lenticular are same, it is possible to perform more precise light exposure work in such a way to change the focal distance of the lenticular lens. The pitches of the lenticular used in the present invention is very fine, but it is possible to variously design the focal distances of the lenticular at even fine pitches.

The term "fine linear light source" of the present invention representatively mans that the line width of the linear light source ranges from a few tens of nanometer sizes to a few tens of microns in size. However, the stepper of the present invention and the linear light source generator of the present invention may be well applied to a region whose range is slightly deviated from the above-mentioned fine range.

When the lenticular system of the present invention uses the term "fine pitches", the range of the fine pitches represents the range from a few microns in size to a few tens of microns in size. However, the lenticular system of the present invention may be well applied to the region whose range is deviated from the above fine range. How the fine lenticular used in the present invention is manufactured is a very important factor, but it is not a subject matter sought to be protected in the present invention, the detailed descriptions thereof will be omitted.

The present invention is directed to a method for manufacturing a micro-sized circuit substrate using a linear light source of a fine line width and a micro-sized circuit thereof. In the related art, the substrate which forms a micro-sized circuit is manufactured by the light exposure work and the etching work or the light exposure work and the plating work. The light source used for the light exposure work with respect to the circuit substrate whose pitches are large is generally obtained from scattering light. For example, the light exposure work with respect to the PCB substrate having the circuit whose line width is large is performed based on the light source of the scattering light. The light exposure work with respect to the circuit substrate having fine pitches has been performed based on parallel light. In the present invention, it is possible to easily perform the light exposure work of the large area using the stepper equipped with the linear light source generator capable of generating micro-sized line widths.

In the method for manufacturing the micro-sized circuit substrate according to the present invention, the light of the light source is scanned onto the lenticular system of the present invention having fine pitches, thus generating the linear light source having micro-sized line width, and the substrate coated with the photo-resist layer is light-exposed using the generated linear light source. Thereafter, the micro-sized substrate is manufactured through the developing process and the etching process performed on the light-exposed substrate.

The substrate manufactured in such a manner that copper is sputtered on the flexible substrate, and copper is plated on the sputtered layer, thus having a copper-plated layer, is generally. It is obvious that the copper may be substituted with a conductive metal. Since the process for performing a developing work and an etching work on the light exposure work-finished substrate is same as the conventional process, so the descriptions thereof will be omitted.

The method for manufacturing the micro-sized circuit substrate using the plating process will be described. First of all, the plating process is performed on the developing work-finished substrate, without performing any etching process. In the space portion from which the non-light exposure portion is eliminated through the developing process, a metallic circuit unit is formed during the plating process. When the circuit unit is fully grown, the plating work is stopped. The light exposure portion is chemically removed. The conductive metal exposed where the light exposure portion is eliminated is removed during the soft etching. So, the fabrication of the micro-sized circuit substrate is completed by means of the plating method. The method for manufacturing the micro-sized circuit substrate through the plating process will be described in details below.

First, a thin conductive layer is formed on the nonconductive support substrate. As the most representative embodiment of the nonconductive support substrate is a polyimide film. In order to form a thin conductive layer, a metal such as copper is sputtered on the nonconductive support substrate, thus forming a very thin conductive layer. When it needs to increase the thickness of the conductive layer, it is obvious that a conductive metal such as copper is thinly plated on the sputtered layer.

In the present invention, the nonconductive support substrate may include a non-flexible material. It is preferred that the nonconductive support substrate uses a flexible substrate which may be wounded in a roll shape for the sake of mass production. The nonconductive support plate used in the present invention is a polyimide film. A photo-resist is coated on top of the conductive layer formed on the non-conductive support substrate. Here, the photo-resist is coated at a thickness ranging from a few microns in size to a few tens of microns in size. In order for the photo-resist to be well coated, it is preferred that the coating is performed after purifying the thin conductive layer through a plasma work.

In the photo-resist, the light of the linear light source having a micro-sized line width from the linear light source generator of the present invention is scanned onto the pattern film. A light exposure unit and a non-light exposure unit are formed through the pattern film on the substrate. When the light of the linear light source is canned through the pattern film onto the photo-resist layer, the portion where is scanned by the light becomes a light exposure unit, and the portion where is not scanned by the light becomes a non-light exposure unit. The space unit is formed by chemically eliminating the non-light exposure unit. A thin conductive layer is formed beneath the space unit.

In the plating tank, the plating is performed by supplying electric power to the exposed conductive layer. A conductive micro-sized circuit is formed on the space unit. As the plating proceeds, such a conductive micro-sized circuit grows on the space unit. When the micro-sized circuit grows and reaches a predetermined height, the plating is topped. The surface of the grown micro-sized circuit may be polished, thus becoming clean. For the polishing, the surface may be polished using a polishing wheel, and it is obvious that the polishing can be performed using various methods.

Thereafter, in order to eliminate the thin conductive layer residing beneath the light exposure unit, the light exposure unit is chemically removed. A space unit is formed where the light exposure unit is removed. A thin conductive layer is exposed from the lower side of the space unit. The exposed thin conductive layer is removed by a soft etching method. When the thin conductive layer is removed, an etching space unit is newly formed. The present invention may be widely used for the process of micro-sized components. As one kind of the micro-sized components, there is a micro-sized metallic circuit. The present invention may be well applied to a chip on film or a FPCB, etc. which has a ultra micro-sized metallic circuit. It is general that the non-conductive support plate is made from a polyimide film.

The micro-sized circuit substrate manufactured according to the method for manufacturing the micro-sized circuit substrate also belongs to the scope of the present invention, Those who skilled in the art can substitute and modify in various forms the disclosure without departing from the technical concept of the present invention, so it should not be interpreted as the present invention is limited to the above-described embodiments and accompanying drawings.

What is claimed is:

1. A stepper, comprising:
   a linear-light source generator configured to condense light having a lined shape, wherein the linear-light source generator, comprising:
   a light source; and
   a lenticular system including a plurality of lenticular lenses, each lenticular lens having a cylindrical shape, wherein a light exposure work of the stepper is performed based on a relative transfer between the linear-light source generator, and a pattern film or a photo mask,
   wherein both the light source and the lenticular system are mounted in a container, and the container is capable of transferring in forward and backward directions or in leftward and rightward directions against a table of the stepper.

2. The stepper of claim 1, wherein in a state that the pattern film or the photo mask is stopped, the light exposure work of the stepper is performed based on a transfer of the linear-light source generator.

3. The stepper of claim 1, wherein in a state that the linear-light source generator is stopped, the light exposure work of the stepper is performed based on a transfer of the pattern film or the photo mask.

4. The stepper of claim 1, wherein both the light source and the lenticular system are mounted in the container, and the container is movable in upward and downward directions against a table of the stepper.

5. The stepper of claim 1, wherein the lenticular is transferred being spaced apart from the pattern film or the photo mask.

6. The stepper of claim 1, wherein the pattern film or the photo mask is disposed at a lower side of the lenticular system, and a substrate on which a photo-resist layer is formed is disposed at a lower side of the pattern film or the photo mask, and the pattern film or the photo mask is spaced apart by a predetermined distance from the substrate.

7. The stepper of claim 1, wherein the pattern film or the photo mask is disposed at a lower side of the lenticular system, and a substrate on which a photo-resist layer is formed is disposed at a lower side of the pattern film or the photo mask, and the pattern film or the photo mask is in close contact with the substrate.

8. The stepper of claim 1, wherein the lenticular system comprises at least one convex lenticular lens.

9. The stepper of claim 1, wherein the lenticular system comprises at least one concave lenticular lens.

10. The stepper of claim 1, wherein the lenticular system is constituted in such a way that at least one convex lenticular and at least one concave lenticular are combined.

11. The stepper of claim 1, wherein the lenticular system comprises at its at least one portion a vertical light lenticular lens, and wherein the vertical light lenticular lens is formed by cutting only the regions being in proximity to a center of each lens of the plurality of lenticular lenses such that the vertical light lenticular lens performs a function of condensing light from the light source and transferring the light downward in a vertical direction.

12. The stepper of claim 1, wherein the lenticular system comprises at its at least one portion a nontransparent shield unit.

13. The stepper of claim 1, wherein the lenticular system comprises at its at least one portion a light shield unit.

14. The stepper of claim 1, wherein the lenticular system comprises at its at least one portion a plane portion, and a light shield unit is disposed at the plane portion.

* * * * *